United States Patent
Oota

(10) Patent No.: US 8,358,057 B2
(45) Date of Patent: Jan. 22, 2013

(54) ORGANIC EL DISPLAY AND METHOD OF MANUFACTURING THE SAME

(75) Inventor: Masuyuki Oota, Hakusan (JP)

(73) Assignee: Japan Display Central Inc., Fukaya-shi (JP)

( * ) Notice: Subject to any disclaimer, the term of this patent is extended or adjusted under 35 U.S.C. 154(b) by 0 days.

(21) Appl. No.: 13/037,027

(22) Filed: Feb. 28, 2011

(65) Prior Publication Data

US 2011/0148290 A1   Jun. 23, 2011

Related U.S. Application Data

(63) Continuation of application No. 12/052,092, filed on Mar. 20, 2008, now abandoned.

(30) Foreign Application Priority Data

Mar. 29, 2007   (JP) ................................. 2007-089265

(51) Int. Cl.
*H01J 1/62* (2006.01)

(52) U.S. Cl. ...................................................... 313/500

(58) Field of Classification Search ........... 313/500–504
See application file for complete search history.

(56) References Cited

U.S. PATENT DOCUMENTS

| | | | |
|---|---|---|---|
| 5,405,710 A * | 4/1995 | Dodabalapur et al. ........ | 428/690 |
| 6,459,199 B1 | 10/2002 | Kido et al. | |
| 6,853,133 B2 | 2/2005 | Liao et al. | |
| 7,482,746 B2 | 1/2009 | Ogawa et al. | |
| 2003/0232563 A1 | 12/2003 | Kamiyama et al. | |
| 2004/0061136 A1 | 4/2004 | Tyan et al. | |
| 2005/0088084 A1 | 4/2005 | Cok | |
| 2005/0194896 A1 | 9/2005 | Sugita et al. | |
| 2005/0249972 A1 | 11/2005 | Hatwar et al. | |
| 2005/0280008 A1 | 12/2005 | Ricks et al. | |
| 2007/0252519 A1 | 11/2007 | Ohba et al. | |
| 2008/0238297 A1 | 10/2008 | Oota | |
| 2009/0108741 A1 | 4/2009 | Yokoyama et al. | |
| 2009/0243466 A1 | 10/2009 | Yokoyama et al. | |
| 2010/0078629 A1 | 4/2010 | Yokoyama et al. | |

(Continued)

FOREIGN PATENT DOCUMENTS

EP   0 903 965   3/1999

(Continued)

OTHER PUBLICATIONS

U.S. Appl. No. 12/914,221, filed Oct. 28, 2010, Sumita, et al.

(Continued)

*Primary Examiner* — Anh Mai
*Assistant Examiner* — Brenitra M Lee
(74) *Attorney, Agent, or Firm* — Oblon, Spivak, McClelland, Maier & Neustadt, L.L.P.

(57) ABSTRACT

An organic EL display includes an array of electrodes including first and second electrodes, a counter electrode, and an organic layer including a first emitting layer interposed between the array of electrodes and the counter electrode and a second emitting layer interposed between the first emitting layer and the counter electrode. Each of the first and second emitting layers is a continuous layer extending over a display region. Portions of a laminate including the array of electrodes, the organic layer and the counter electrode that correspond to the first and second electrodes form first and second organic EL elements different in luminous colors from each other.

2 Claims, 27 Drawing Sheets

U.S. PATENT DOCUMENTS

| | | |
|---|---|---|
| 2010/0176412 A1 | 7/2010 | Yokoyama et al. |
| 2010/0221857 A1* | 9/2010 | Cok ............................... 438/34 |

FOREIGN PATENT DOCUMENTS

| | | |
|---|---|---|
| JP | 10-3990 | 1/1998 |
| JP | 2001-76870 | 3/2001 |
| JP | 2001-131434 | 5/2001 |
| JP | 2003-157973 | 5/2003 |
| JP | 2005-100921 | 4/2005 |
| JP | 2006-092936 | 4/2006 |
| JP | 2006-324016 | 11/2006 |
| JP | 3849066 | 11/2006 |
| JP | 2007-108248 | 4/2007 |
| JP | 2007-242600 | 9/2007 |
| JP | 2007/299729 | 11/2007 |
| KR | 2000-0011034 | 2/2000 |
| KR | 10-2007-0108075 | 11/2007 |
| TW | 200706912 A | 2/2007 |
| TW | 200707720 A | 2/2007 |
| WO | WO 97/43874 | 11/1997 |
| WO | WO 2007/129834 | 11/2007 |

OTHER PUBLICATIONS

U.S. Appl. No. 12/952,980, filed Nov. 23, 2010, Yokoyama, et al.
U.S. Appl. No. 12/977,781, filed Dec. 23, 2010, Yokoyama, et al.
U.S. Appl. No. 13/025,455, filed Feb. 11, 2011, Sumita, et al.
Japanese Office Action issued Feb. 21, 2012 in Patent Application No. 2008-074472 with English Translation.
Taiwanese Office Action issued Feb. 21, 2012 in Patent Application No. 097110383 with English Translation.

* cited by examiner

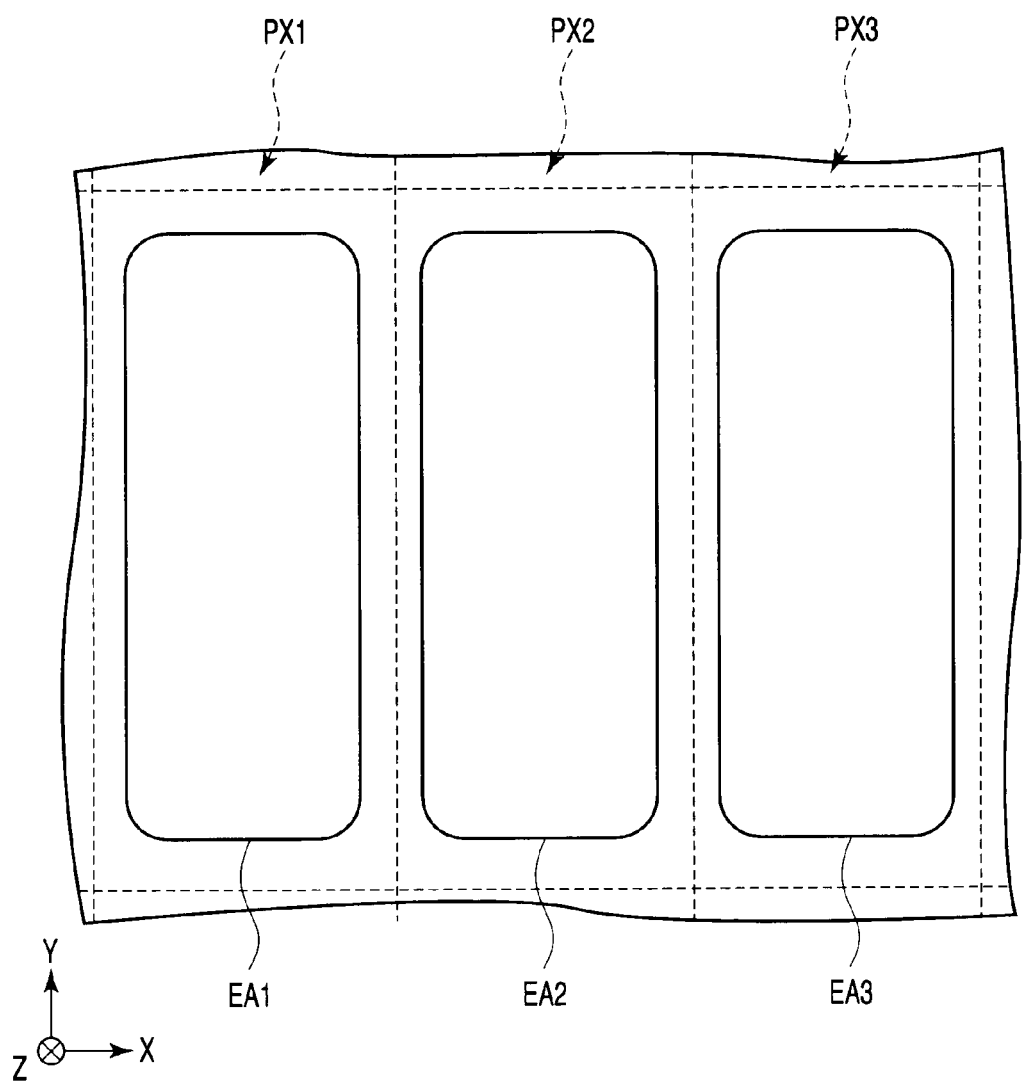
F I G. 4

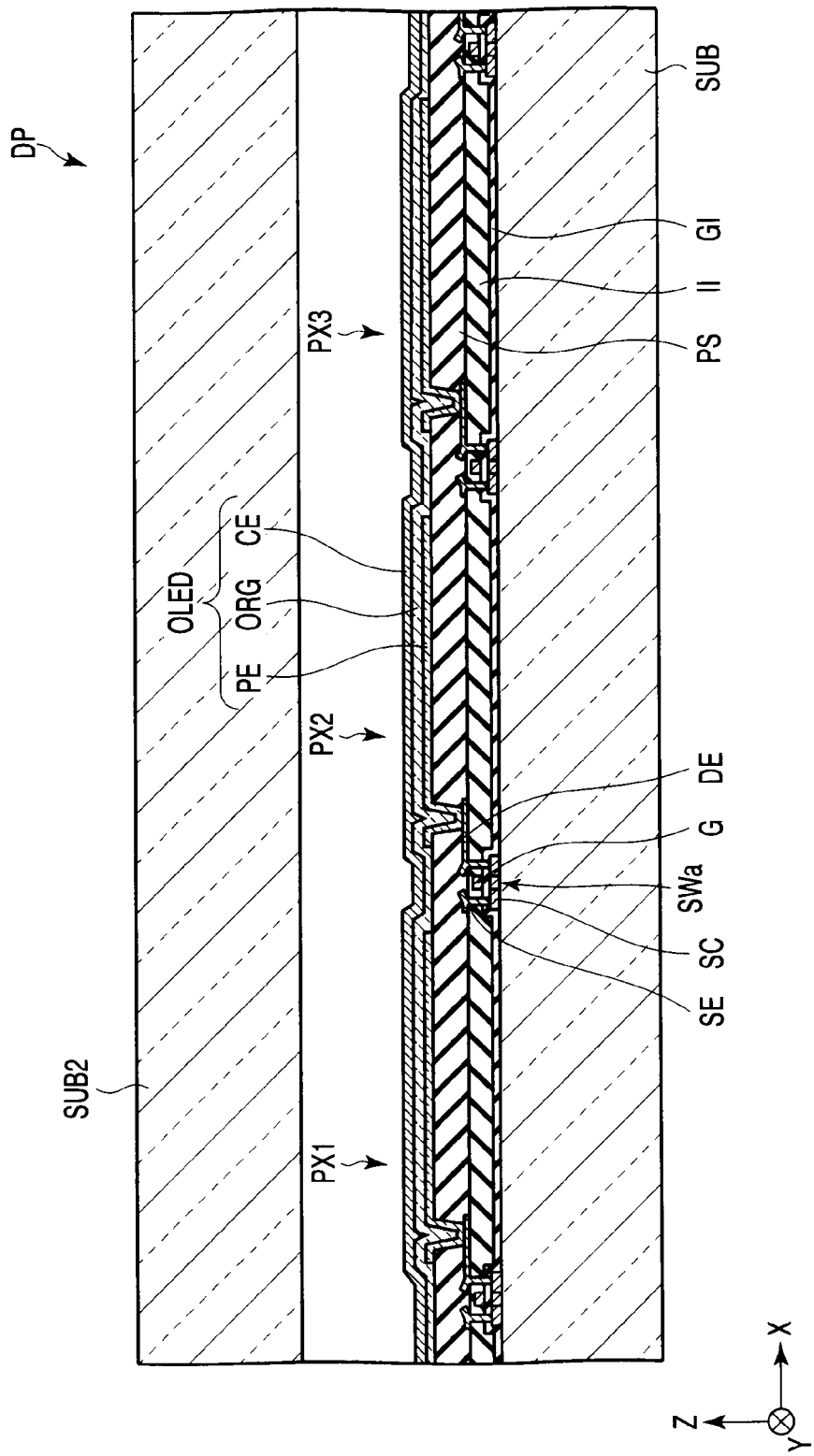
F I G. 26

ORGANIC EL DISPLAY AND METHOD OF MANUFACTURING THE SAME

CROSS-REFERENCE TO RELATED APPLICATIONS

This application is continuation of and claims the benefit of priority under 35 U.S.C. §120 from U.S. Ser. No. 12/052,092 filed Mar. 20, 2008, and claims the benefit of priority under 35 U.S.C. §119 from Japanese Patent Application No. 2007-089265 filed Mar. 29, 2007, the entire contents of each of which are incorporated herein by reference.

BACKGROUND OF THE INVENTION

1. Field of the Invention

The present invention relates to an organic electroluminescent (hereinafter referred to as "EL") display technique.

2. Description of the Related Art

Flat-panel displays, typified by liquid crystal displays, are lower in profiles and power consumptions and lighter in weights as compared with CRT (cathode-ray tube) displays. By virtue of such characteristics, the demand for flat-panel displays has been growing sharply. For example, flat-panel displays are utilized as the displays of portable and stationary devices.

Organic EL displays are self-emission displays, thus are advantageous in achieving a higher response speed, wider viewing angle, higher contrast, lower profile and lighter weight as compared with liquid crystal displays. For this reason, organic EL displays have been studied actively in recent years.

An organic EL display includes an organic EL element. The organic EL element includes an anode, a cathode, and an emitting layer interposed therebetween. In the emitting layer, recombination of holes from the anode and electrons from the cathode occurs. As a result, the emitting layer emits light.

An organic EL display can display a full-color image when such a structure is employed that organic EL elements different in luminescent colors from one another are arranged. For example, a full-color image can be displayed on the organic EL display in which pixels of red, green and blue luminescent colors are arranged.

When such a structure is employed, it is necessary in manufacturing an organic EL display to form patterned emitting layers whose emitting colors are red, green and blue. For example, when low molecular-weight substances are used as the materials of the emitting layers, each patterned emitting layer is formed by vacuum evaporation using a fine metal mask as described in JP-A 2003-157973 (KOKAI).

In this method, however, higher the definition or resolution, greater the effect of the position accuracy on the display quality becomes. For example, when the sizes of pixels are small, the color mixture is prone to occur. This is because the fine metal mask used in vacuum evaporation is lower in accuracies of pattern shape and pattern size than the photomask used in photolithography and the fine metal mask expands or is deformed due to the radiant heat from the evaporation source in contrast to the photolithography using the photomask.

This problem is more serious when the fine metal mask is large. Thus, when emitting layers are formed using fine metal masks, organic EL displays, in particular, oversized organic EL displays are difficult to manufacture at high yields.

BRIEF SUMMARY OF THE INVENTION

An object of the present invention is to make it possible, in the production of the organic EL display that can display a multi-color image, to form emitting layers without using fine metal mask.

According to a first aspect of the present invention, there is provided an organic EL display comprising an insulating substrate, an array of electrodes including first and second electrodes and supported by the insulating substrate, a counter electrode facing the array of electrodes, an organic layer including a first emitting layer interposed between the array of electrodes and the counter electrode and a second emitting layer interposed between the first emitting layer and the counter electrode, each of the first and second emitting layers being a continuous layer extending over a display region including the array of electrode, wherein portions of a laminate including the array of electrodes, the organic layer and the counter electrode that correspond to the first and second electrodes form first and second organic EL elements different in luminous colors from each other.

According to a second aspect of the present invention, there is provided a method of manufacturing an organic EL display, comprising depositing a first luminescent organic material over an array of electrodes supported by an insulating substrate to form a first emitting layer as a continuous layer that extends over a display region including the array of electrodes, and irradiating a region of the first emitting layer that faces a part of the electrodes with a first light without irradiating a region of the first emitting layer that faces another part of the electrodes with the first light so as to transform the first luminescent organic material in the region of the first emitting layer irradiated with the first light into a material different from the first luminescent organic material.

BRIEF DESCRIPTION OF THE SEVERAL VIEWS OF THE DRAWING

FIG. 4 is a plan view schematically showing an example of the arrangement of the pixels that can be employed in the display shown in FIG. 1;

FIG. 26 is a sectional view schematically showing an example of the structure that can be employed in the organic EL display according to the fifteenth embodiment of the present invention.

DETAILED DESCRIPTION OF THE INVENTION

Figure 1:
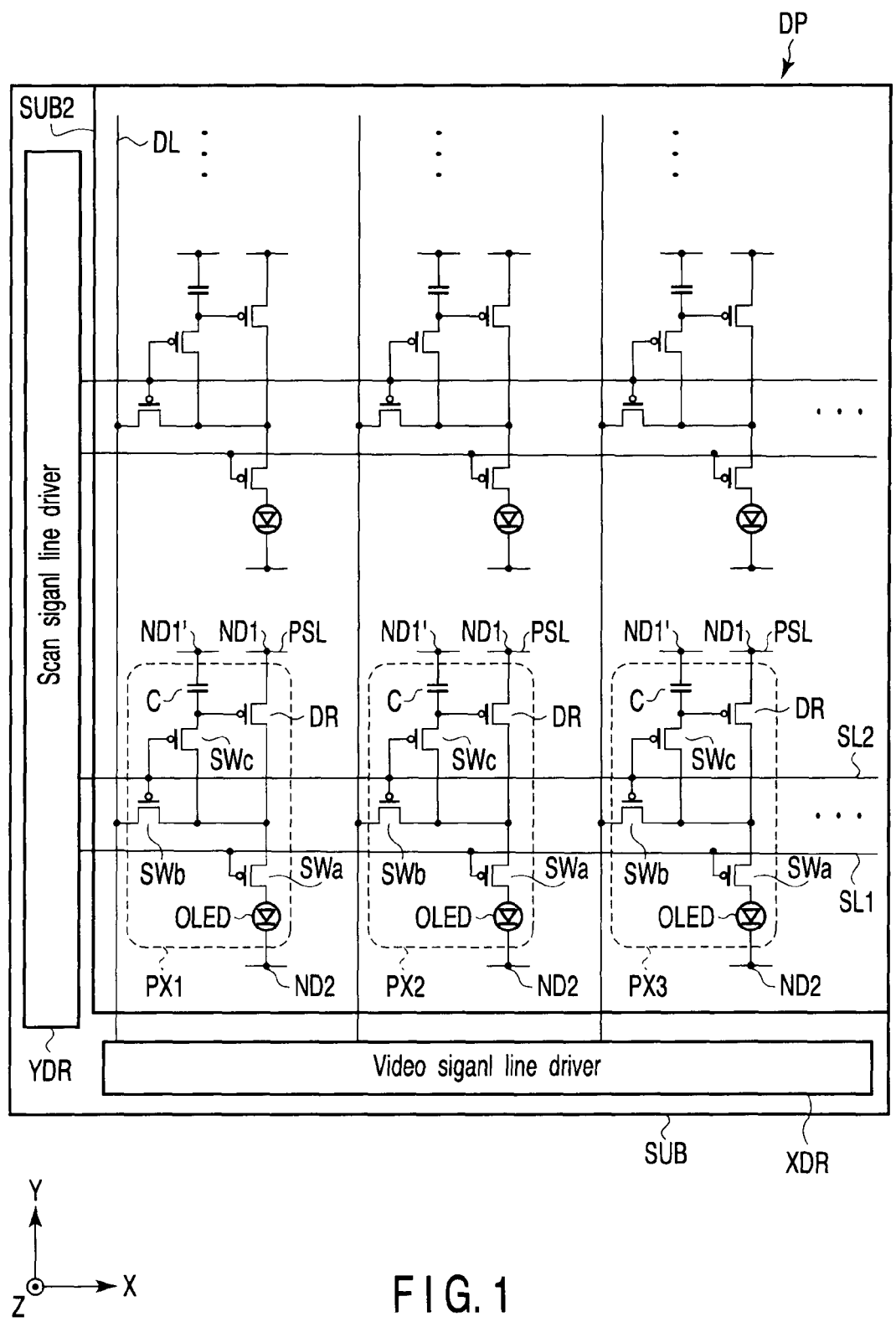
FIG. 1 is a plan view schematically showing a display according to a first embodiment of the present invention.

Embodiments of the present invention will be described below in detail with reference to the drawings. In the drawings, the same reference characters denote components having the same or similar functions and duplicate descriptions will be omitted.

First Embodiment

Figure 2:
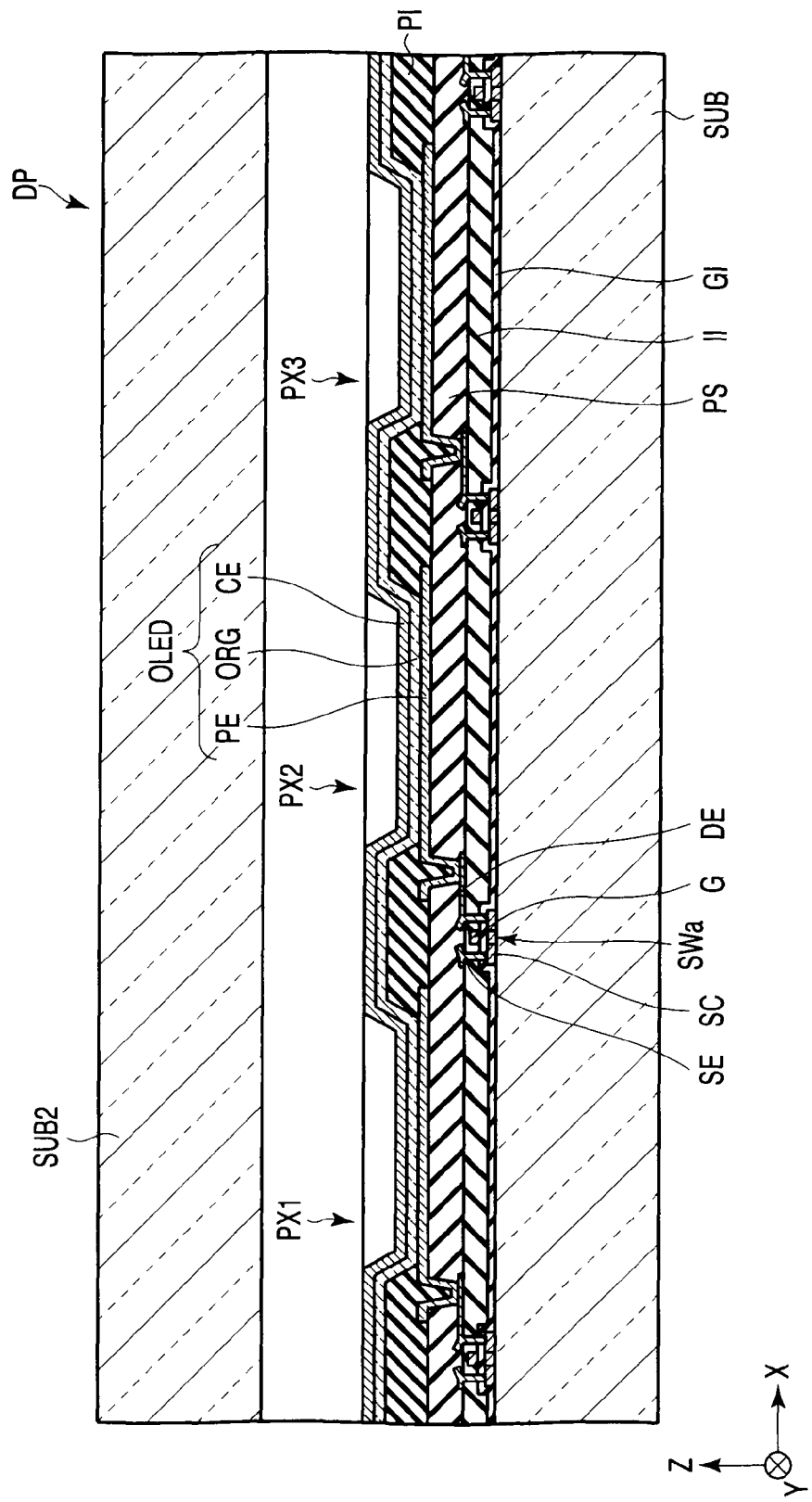
FIG. 2 is a sectional view schematically showing an example of the structure that can be employed in the display shown in FIG. 1.

FIG. 1 is a plan view schematically showing a display according to a first embodiment of the present invention. FIG. 2 is a sectional view schematically showing an example of the structure that can be employed in the display shown in FIG. 1.

Figure 3:
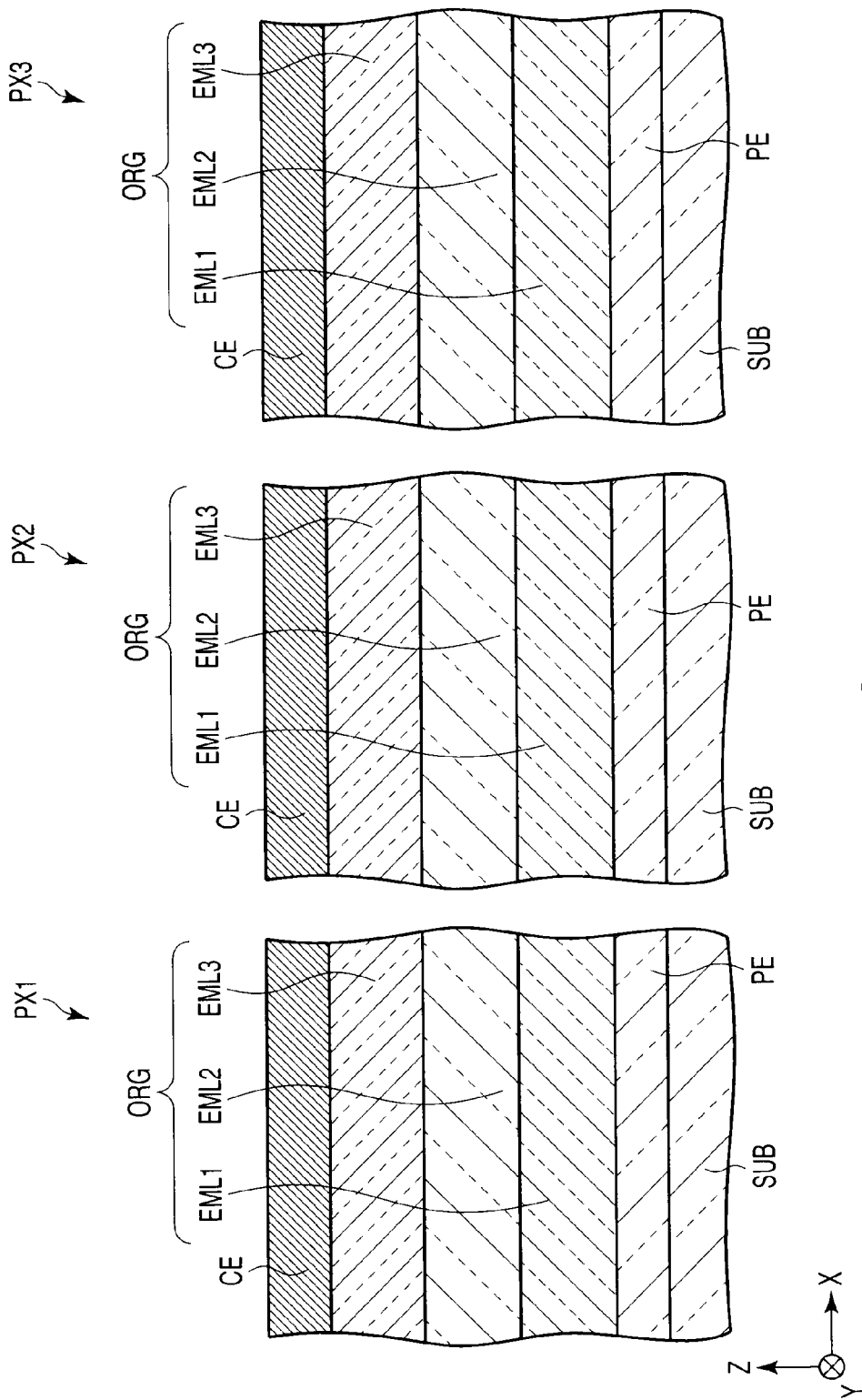
FIG. 3 is a sectional view schematically showing the organic EL elements of the display shown in FIG. 1.

FIG. 3 is a sectional view schematically showing the organic EL elements of the display shown in FIG. 1. FIG. 4 is a plan view schematically showing an example of the arrangement of the pixels that can be employed in the display shown in FIG. 1.

The display shown in FIGS. 1 and 2 is a bottom emission organic EL display that employs an active matrix driving method. The display includes a display panel DP, a video signal line driver XDR, and a scan signal line driver YDR.

As shown in FIGS. 1 and 2, the display panel DP includes the insulating substrate SUB such as glass substrate. The substrate SUB has a light-transmitting property in the present embodiment. An undercoat layer (not shown) is formed on the substrate SUB. The undercoat layer includes an $SiN_x$ layer and an $SiO_x$ layer stacked on the substrate SUB in this order, for example.

On the undercoat layer, formed is a semiconductor pattern made of, for example, polysilicon containing impurities. Parts of the semiconductor pattern are utilized as the semiconductor layers SC shown in FIG. 2. In each semiconductor layer SC, impurity diffusion regions utilized as source and drain are formed. Other parts of the semiconductor pattern are utilized as the bottom electrodes of the capacitors C. The bottom electrodes are arranged correspondently with the pixels PX1 to PX3.

Note that the pixels PX1 to PX3 form triplets each constituted by three pixels PX1 to PX3 arranged in the X-direction. In the display region, the triplets are arranged two-dimensionally. For example, the pixels PX1 to PX3 form in the display region first columns of pixels each constituted by the pixels PX1 arranged in the Y-direction, second columns of pixels each constituted by the pixels PX2 arranged in the Y-direction, and third columns of pixels each constituted by the pixels PX3 arranged in the Y-direction.

The semiconductor pattern is covered with the gate insulator GI shown in FIG. 2. The gate insulator GI can be formed, for example, by using tetraethyl orthosilicate (TEOS).

On the gate insulator GI, the scan signal lines SL1 and SL2 shown in FIG. 1 are arranged. The scan signal lines SL1 and SL2 extend in the X-direction and are alternately arranged in the Y-direction. For example, the scan signal lines SL1 and SL2 are made of MoW.

On the gate insulator GI, the top electrodes of the capacitors C are further arranged. The top electrodes are arranged correspondently with the pixels PX1 to PX3 and face the bottom electrodes. The top electrodes are made of MoW, for example. The top electrodes can be formed in the same step as that for the scan signal lines SL1 and SL2.

The scan signal lines SL1 and SL2 intersect the semiconductor layers SC. The intersection portions where the scan signal lines SL1 intersect the semiconductor layers SC form the switching transistors SWa shown in FIGS. 1 and 2. The intersection portions where the scan signal lines SL2 intersect the semiconductor layers SC form the switching transistors SWb and SWc shown in FIG. 1. The bottom electrodes, the top electrodes, and the insulating layer GI interposed therebetween form the capacitors shown in FIG. 1. The top electrodes include extensions that intersect the semiconductor layers SC. The intersection portions where the extensions intersect the semiconductor layers SC form the drive transistors DR shown in FIG. 1.

Note that in this embodiment, the drive transistor DR and the switching transistors SWa to SWc are top-gate type p-channel thin-film transistors. Note also that the portions denoted by the reference symbol G are gates of the switching transistors SWa.

The gate insulator GI, the scan signal lines SL1 and SL2, and the top electrodes are covered with the interlayer insulating film II shown in FIG. 2. For example, the interlayer insulating film II is an $SiO_x$ layer formed by plasma chemical vapor deposition (CVD).

On the interlayer insulating film II, the video signal lines DL and the power supply lines PSL shown in FIG. 1 are formed. The video signal lines DL extend in the Y-direction and are arranged in the X-direction. The power supply lines PSL extend in the Y-direction and are arranged in the X-direction, for example.

On the interlayer insulating film II, the source electrodes and the drain electrodes shown in FIG. 2 are further formed. The source electrodes SE and the drain electrodes DE are connected to the impurity diffusion regions formed in the semiconductor layers SC via the contact holes formed in the interlayer insulating film II. The source electrodes SE and the drain electrodes DE connect the elements together in each of the pixels PX1 to PX3.

For example, the video signal lines DL, the power supply lines PSL, source electrodes SE, and drain electrodes DE have a three-layer structure. These components can be formed in the same step.

The video signal lines DL, the power supply lines PSL, the source electrodes SE, and the drain electrodes DE are covered with the passivation layer PS shown in FIG. 2. The passivation layer PS is made of $SiN_x$, for example.

On the passivation layer PS, the pixel electrodes PE shown in FIG. 2 are arranged correspondingly with the pixels PX1 to PX3. Each pixel electrode PE is connected via the contact hole formed in the passivation layer PS to the drain electrode DE that is connected to the drain of the switching transistor SWa.

In this embodiment, the pixel electrodes PE are front electrodes. Also, in this embodiment, the pixel electrodes PE are anodes. As material of the pixel electrodes PE, for example, transparent conductive oxides such as indium tin oxide (ITO) can be used.

On the passivation layer PS, the insulating partition layer PI shown in FIG. 2 is further formed. The insulating partition layer PI is provided with through-holes at positions corresponding to the pixel electrodes PE. Alternatively, the insulating partition layer PI is provided with slits at positions corresponding to columns of the pixel electrodes PE. As an example, it is supposed that through-holes are formed in the insulating partition layer PI at positions corresponding to the pixel electrodes PE.

The insulating partition layer PI is, for example, an organic insulating layer. The insulating partition layer PI can be formed by using photolithography technique, for example.

On the pixel electrodes PE, the organic layer ORG including emitting layers is formed. Typically, the organic layer ORG is a continuous layer extending over the display region, which is defined as a region including all the pixels PX1 to PX3 or defined as a region including all the organic EL elements OLED. That is, typically, the organic layer ORG covers the pixel electrodes PE and the insulating partition layer PI. The organic layer is described in more detail later.

The insulating partition layer PI and the organic layers ORG are covered with the counter electrode CE. In this embodiment, the counter electrode CE is a common electrode shared among the pixels PX1 to PX3. For example, an electrode wire (not shown) is formed on the layer on which the video signal lines DL are formed, and the counter electrode CE is electrically connected to the electrode wire via the contact hole formed in the passivation layer PS and the insulating partition layer PI. Note that in this embodiment, the counter electrode CE further serves as a reflective layer.

The pixel electrodes PE, the organic layer ORG, and the counter electrode CE form the organic EL elements OLED arranged correspondingly with the pixel electrodes PE. In the example shown in FIG. 4, the reference symbols EA1 to EA3 denote the portions of the pixels PX1 to PX3 from which the organic EL elements OLED emit light, respectively. The light-emitting portions EA1 to EA3 have rectangular shapes elongated in the Y-direction. In the structure shown in FIG. 4, the light-emitting portions EA1 to EA3 have the same area.

The areas of the light-emitting portions EA1 to EA3 may be different from one another. When the pixel whose luminous efficiency is low is larger in the areas of the light-emitting portions than the pixel whose luminous efficiency is high, it is possible to make the lifetimes of the organic EL elements included in the pixels almost equal to each other.

For example, in the case where the lifetime of the organic EL element OLED included in the pixel PX3 is shorter than the lifetimes of the organic EL elements OLED included in the pixels PX1 and PX2, the display after long-term use displays a colored white image when driven under the conditions that the display just after the manufacture thereof displays a true white image. The coloring of the white image can be prevented by making the lifetimes of the organic EL elements OLED included in the PX1 to PX3 almost equal to one another.

As shown in FIG. 1, each of the pixels PX1 to PX3 includes the drive transistor DR, the switching transistors SWa to SWc, the organic EL element OLED, and the capacitor C. As described above, in this embodiment, the drive transistor DR and the switching transistors SWa to SWc are p-channel thin-film transistors.

The drive transistor DR, the switching transistor SWa, and the organic EL element OLED are connected in series between the first power supply terminal ND1 and the second power supply terminal ND2 in this order. In this embodiment, the power supply terminal ND1 is a high-potential power supply terminal, and the power supply terminal ND2 is a low-potential power supply terminal.

The gate of the switching transistor SWa is connected to the scan signal line SL1. The switching transistor SWb is connected between the video signal line DL and the drain of the drive transistor DR, and its gate is connected to the scan signal line SL2. The switching transistor SWc is connected between the drain and gate of the drive transistor DR, and its gate is connected to the scan signal line SL2.

The capacitor C is connected between the gate of the drive transistor DR and the constant-potential terminal ND1'. In this embodiment, the constant-potential terminal ND1' is connected to the power supply terminal ND1.

The video signal line driver XDR and the scan signal line driver YDR are mounted on the substrate SUB. To be more specific, the video signal line driver XDR and the scan signal line driver YDR are connected to the display panel DP in the chip-on-glass (COG) manner. Instead, the video signal line driver XDR and the scan signal line driver YDR may be connected to the display panel DP by using the tape carrier package (TCP). Alternatively, The video signal line driver XDR and the scan signal line driver YDR may be formed on the substrate SUB.

The video signal lines DL are connected to the video signal line driver XDR. In this embodiment, the power supply lines PSL are further connected to the video signal line driver XDR. The video signal line driver XDR outputs current signals as video signals to the video signal lines DL, and outputs a supply voltage to the power supply lines PSL.

The scan signal lines SL1 and SL2 are connected to the scan signal line driver YDR. The scan signal line driver YDR outputs voltage signals as first and second scan signals to the scan signal lines SL1 and SL2, respectively.

The display panel DP further includes the sealing substrate SUB2. The sealing substrate SUB2 and the insulating substrate SUB face each other with the organic EL elements interposed therebetween and form a hollow body. To be more specific, the center of the sealing substrate SUB2 is spaced apart from the organic EL elements OLED. The peripheral of the sealing substrate SUB2 is adhered to one major surface of the insulating substrate SUB via a frame-shaped sealing layer (not shown).

The sealing substrate SUB2 is, for example, a transparent substrate such as glass substrate. Desiccant may be provided on the major surface of the sealing substrate SUB2 that faces the insulating substrate SUB.

When an image is to be displayed on the organic EL display, the scan signal lines SL2 are sequentially energized. That is, the pixels PX1 to PX3 are selected on a line-by-line basis. In a selection period over which one of the rows is selected, write operations are executed on the pixels PX1 to PX3 included in the selected row. In a non-selected period over which the row is not selected, display operations are executed on the pixels PX1 to PX3 included in the non-selected row.

During the selection period over which the pixels PX1 to PX3 included in one of the rows are selected, the scan signal line driver YDR outputs a scan signal for opening the switching transistors SW1, i.e., a scan signal for bringing switching transistors SWa to a non-conducting state as a voltage signal to the scan signal line SL1 to which the selected pixels PX1 to PX3 are connected. Subsequently, the scan signal line driver YDR outputs a scan signal for closing the switching transistors SWb and SWc, i.e., a scan signal for bringing the switching transistors SWb and SWc to a conducting state as a voltage signal to the scan signal line SL2 to which the selected pixels PX1 to PX3 are connected. In this state, the video signal line driver XDR outputs a video signal as a current signal (write current) $I_{sig}$ to each of the video signal lines DL, so as to set the gate-to-source voltage $V_{gs}$ of the drive transistor DR at a value corresponding to the magnitude of the video signal $I_{sig}$. Then, the scan signal line driver YDR outputs a scan signal for opening the switching transistors SWb and SWc as a voltage signal to the scan signal line SL2 to which the selected pixels PX1 to PX3 are connected. Subsequently, the scan signal line driver YDR outputs a scan signal for closing the switching transistors SWa as a voltage signal to the scan signal line SL1 to which the selected pixels PX1 to PX3 are connected. This terminates the selection period.

During the non-selection period following the selection period, the switching transistors SWa are kept closed, and the switching transistors SW2 and SW3 are kept open. In the non-selection period, a drive current $I_{drv}$ flows through each organic EL element OLED at magnitude corresponding to the gate-to-source voltage $V_{gs}$ of the drive transistor DR. The organic EL element OLED emits light at luminance corresponding to the magnitude of the drive current $I_{drv}$. In other words, since the drive current $I_{drv}$ and the video signal $I_{sig}$ are almost equal in magnitudes to each other, it is possible to make the organic EL element OLED to emit light at luminance corresponding to the magnitude of the video signal $I_{sig}$.

Although, the display employs the pixel circuit shown in FIG. 1, there is no limitation on the pixel circuit as long as that can control the magnitude of the drive current according to the magnitude of the video signal. For example, the pixel circuit may have such a structure that a voltage signal is utilized instead of the current signal as the video signal supplied from the video signal line DL to the pixel circuit. In addition, n-channel thin-film transistors may be used instead of the p-channel thin-film transistors.

In this display, each organic layer ORG of the pixels PX1 to PX3 includes the laminate of the first emitting layer EML1, the second emitting layer EML2, and the third emitting layer EML3. That is, the organic layers ORG of the pixels PX1 to PX3 have the same layered-structures. Typically, each of the emitting layers EML1 to EML3 is a continuous layer extending over the display region.

Each of the emitting layers EML1 to EML3 includes a luminescent organic material such as luminescent organic compound or composition. Here, as an example, it is assumed that each of the emitting layer EML1 to EML3 includes a mixture of a host material and a dopant material. In this case, in each of the emitting layers EML1 to EML3, the recombination of electrons and holes excites the host material, and energy is transferred from the excited host material to the dopant material. As a result, the dopant material emits light.

The emitting layers EML1 to EML3 are different in materials and emitting colors from one another. In the present embodiment, the dominant wavelength $\lambda_1$ of light emitted by the emitting layer EML1 is longer than the dominant wavelength $\lambda_2$ of light emitted by the emitting layer EML2. This dominant wavelength $\lambda_2$ is longer than the dominant wavelength $\lambda_3$ of light emitted by the emitting layer EML3. As an example, it is assumed that the emitting color of the emitting layer EML1 is red, the emitting color of the emitting layer EML2 is green, and the emitting color of the emitting layer EML3 is blue.

Note that according to a common definition, the color of light with wavelengths of 400 nm to 435 nm is purple, the color of light with wavelengths of 435 nm to 480 nm is blue, the color of light with wavelengths of 480 nm to 490 nm is greenish blue, the color of light with wavelengths of 490 nm to 500 nm is bluish green, the color of light with wavelengths of 500 nm to 560 nm is green, the color of light with wavelengths of 560 nm to 580 nm is yellow green, the color of light with wavelengths of 580 nm to 595 nm is yellow, the color of light with wavelengths of 595 nm to 610 nm is orange, the color of light with wavelengths of 610 nm to 750 nm is red, and the color of light with wavelengths of 750 nm to 800 nm is reddish purple. In this context, the color of light with the dominant wavelength of 400 nm to 490 nm is defined as blue, the color of light with the dominant wavelength longer than 490 nm and shorter than 595 nm is defined as green, and the color of light with the dominant wavelength of 595 nm to 800 nm is defined as blue.

The absorption spectrum of the dopant material in the emitting layer EML1 at least partially overlaps the emission spectrum of the emitting layer EML2. The absorption spectrum of the dopant material in the emitting layer EML2 at least partially overlaps the emission spectrum of the emitting layer EML3. Typically, the absorption spectrum of the dopant material in the emitting layer EML1 at least partially overlaps the emission spectrum of the emitting layer EML3.

The region of the emitting layer EML1 that corresponds to the emitting portion EA1 shown in FIG. 4 is different in physical properties from the regions of the emitting layer EML1 that correspond to the emitting portions EA2 and EA3 shown in FIG. 4. Thus, the region of the emitting layer EML1 corresponding to the emitting portion EA1 emits light at a higher efficiency as compared with the regions of the emitting layer corresponding to the emitting portions EA2 and EA3.

For example, the content of the dopant material that can emit light in the region of the emitting layer EML1 corresponding to the emitting portion EA1 is higher than those in the regions of the emitting layer EML1 corresponding to the emitting portions EA2 and EA3. In this case, typically, most of the dopant material in the region of the emitting layer EML1 corresponding to the emitting portion EA1 can emit light, while most of the dopant material in the regions of the emitting layer EML1 corresponding to the emitting portions EA2 and EA3 is quenched or cannot be excited. Alternatively, the region of the emitting layer EML1 corresponding to the emitting portion EA1 is different in electrical characteristics from the regions of the emitting layer EML1 corresponding to the emitting portions EA2 and EA3. In this case, typically, the region of the emitting layer EML1 corresponding to the emitting portion EA1 is lower in hole mobility and/or hole injection efficiencies than the regions of the emitting layer EML1 corresponding to the emitting portions EA2 and EA3. Here, as an example, it is assumed that most of the dopant material in the region of the emitting layer EML1 corresponding to the emitting portion EA1 can emit light, most of the dopant material in the regions of the emitting layer EML1 corresponding to the emitting portions EA2 and EA3 is quenched or cannot be excited, and the region of the emitting layer EML1 corresponding to the emitting portion EA1 is lower in hole mobility and/or hole injection efficiencies than the regions of the emitting layer EML1 corresponding to the emitting portions EA2 and EA3.

The materials of the regions of the emitting layer EML1 that correspond to the emitting portions EA2 and EA3 are the same as that can be obtained by irradiating the material of the region of the emitting layer EML1 corresponding to the emitting portion EA1 with light, for example, ultraviolet light. The light irradiation causes the decomposition or polymerization of at least one component of the material, for example the dopant material, or causes the change in the molecular structure thereof. As a result, the above-described difference in physical properties is produced.

The regions of the emitting layer EML2 that correspond to the emitting portions EA1 and EA2 shown in FIG. 4 are different in physical properties from the region of the emitting layer EML2 that corresponds to the emitting portion EA3 shown in FIG. 4. Thus, the regions of the emitting layer EML2 corresponding to the emitting portions EA1 and EA2 emit light at a higher efficiency as compared with the region of the emitting layer corresponding to the emitting portion EA3.

For example, the content of the dopant material that can emit light in each of the regions of the emitting layer EML2 corresponding to the emitting portions EA1 and EA2 is higher than that in the region of the emitting layer EML2 corresponding to the emitting portion EA3. In this case, typically, most of the dopant material in each of the regions of the emitting layer EML2 corresponding to the emitting portions EA1 and EA2 can emit light, while most of the dopant material in the region of the emitting layer EML2 corresponding to the emitting portion EA3 is quenched or cannot be excited. Alternatively, the regions of the emitting layer EML2 corresponding to the emitting portions EA1 and EA2 are different in electrical characteristics from the region of the emitting layer EML2 corresponding to the emitting portion EA3. In this case, typically, the regions of the emitting layer EML2 corresponding to the emitting portions EA1 and EA2 are lower in hole mobility and/or hole injection efficiencies than the region of the emitting layer EML2 corresponding to the emitting portion EA3. Here, as an example, it is assumed that most of the dopant material in the regions of the emitting layer EML2 corresponding to the emitting portions EA1 and EA2 can emit light, most of the dopant material in the region of the emitting layer EML2 corresponding to the emitting portion EA3 is quenched or cannot be excited, and the regions of the emitting layer EML2 corresponding to the emitting portions EA1 and EA2 are lower in hole mobility and/or hole injection efficiencies than the region of the emitting layer EML2 corresponding to the emitting portion EA3.

The material of the region of the emitting layer EML2 that correspond to the emitting portion EA3 is the same as that can be obtained by irradiating the material of the regions of the emitting layer EML2 corresponding to the emitting portions EA1 and EA2 with light, for example, ultraviolet light. The light irradiation causes the decomposition or polymerization of at least one component of the material, for example the dopant material, or causes the change in the molecular structure thereof. As a result, the above-described difference in physical properties is produced.

In the case where the light irradiation is not performed, the emitting portions EA1 to EA3 emit lights having the same colors. Thus, in this case, the display cannot display a multicolored image.

By contrast, in this display, each of the emitting layers EML1 and EML2 includes the irradiated region and the non-irradiated region different in physical properties from each other. Therefore, the emitting portions EA1 to EA3 emit lights having different colors as follows.

As described above, the emitting portions EA2 and EA3 is higher in hole mobility and/or hole injection efficiencies of the emitting layer EML1 than the emitting portion EA1. In addition, the emitting portion EA3 is higher in hole mobility and/or hole injection efficiencies of the emitting layer EM2 than the emitting portions EA1 and EA2.

Thus, it is possible, for example, that the emitting portion EA1 has the optimum electron/hole injection balance at the emitting layer EML1, the emitting portion EA2 has the optimum electron/hole injection balance at the emitting layer EML2, and the emitting portion EA3 has the optimum electron/hole injection balance at the emitting layer EML3. That is, it is possible to cause the recombination of electrons and holes in the emitting portion EA1 mainly at the emitting layer EML1, the recombination of electrons and holes in the emitting portion EA2 mainly at the emitting layer EML2, and the recombination of electrons and holes in the emitting portion EA3 mainly at the emitting layer EML3.

In the emitting portion EA1, the recombination of electrons and holes occurs in the emitting layers EML2 and EML3, although the recombination mainly occurs in the emitting layer EML1. Thus, in the emitting portion EA1, each of the emitting layers EML1 to EML3 can emit light.

However, in the emitting portion EA1, the dopant material in the emitting layer EML1 absorbs the light emitted by the emitting layer EML2 and EML3 so as to emit light. Note that the dopant material in the emitting layer EML2 also causes such light emission by absorbing the light emitted by the emitting layer EML3, but hardly causes such light emission by absorbing the light emitted by the emitting layer EML1. Further, the dopant material in the emitting layer EML3 hardly causes such light emission by absorbing light emitted by the emitting layer EML1 or EML2.

In summary, in the emitting portion EA1, at least a part of the light emitted by the emitting layer EML3 is converted into the light having the emission spectra of the dopant materials in the emitting layers EML1 and EML2. Further, at least a part of the light emitted by the emitting layer EML2 is converted into the light having the emission spectrum of the dopant material in the emitting layer EML1.

Therefore, the emission color of the emitting portion EA1 is almost the same as the emission color of the emitting layer EML1. For example, the emitting portion EA1 emits red light.

In the emitting portion EA2, the recombination of electrons and holes occurs in the emitting layers EML1 and EML3, although the recombination mainly occurs in the emitting layer EML2. Since, in the emitting portion EA2, the emitting layer EML1 does not contain the dopant material that can emit light, each of the emitting layers EML2 and EML3 can emit light.

Since, in the emitting portion EA2, the emitting layer EML1 does not contain the dopant material that can emit light, the above-described color conversion does not occur in the emitting layer EML1. On the other hand, in the emitting layer EML2, the above-described color conversion occurs. Therefore, the emission color of the emitting portion EA2 is almost the same as the emission color of the emitting layer EML2. For example, the emitting portion EA2 emits green light.

In the emitting portion EA3, the recombination of electrons and holes occurs in the emitting layers EML1 and EML2, although the recombination mainly occurs in the emitting layer EML3. Since, in the emitting portion EA3, the emitting layers EML1 and EML2 do not contain the dopant material that can emit light, only the emitting layer EML3 can emit light.

Since, in the emitting portion EA3, the emitting layers EML1 and EML2 do not contain the dopant material that can emit light, the above-described color conversion does not occur in the emitting layers EML1 and EML2. Therefore, the emission color of the emitting portion EA3 is almost the same as the emission color of the emitting layer EML3. For example, the emitting portion EA3 emits blue light.

Thus, when the above-described structure is employed in the organic layer ORG, the emitting portions EA1 to EA3 emit different colors.

The display can be manufactured, for example, by the following method.

Figure 5:
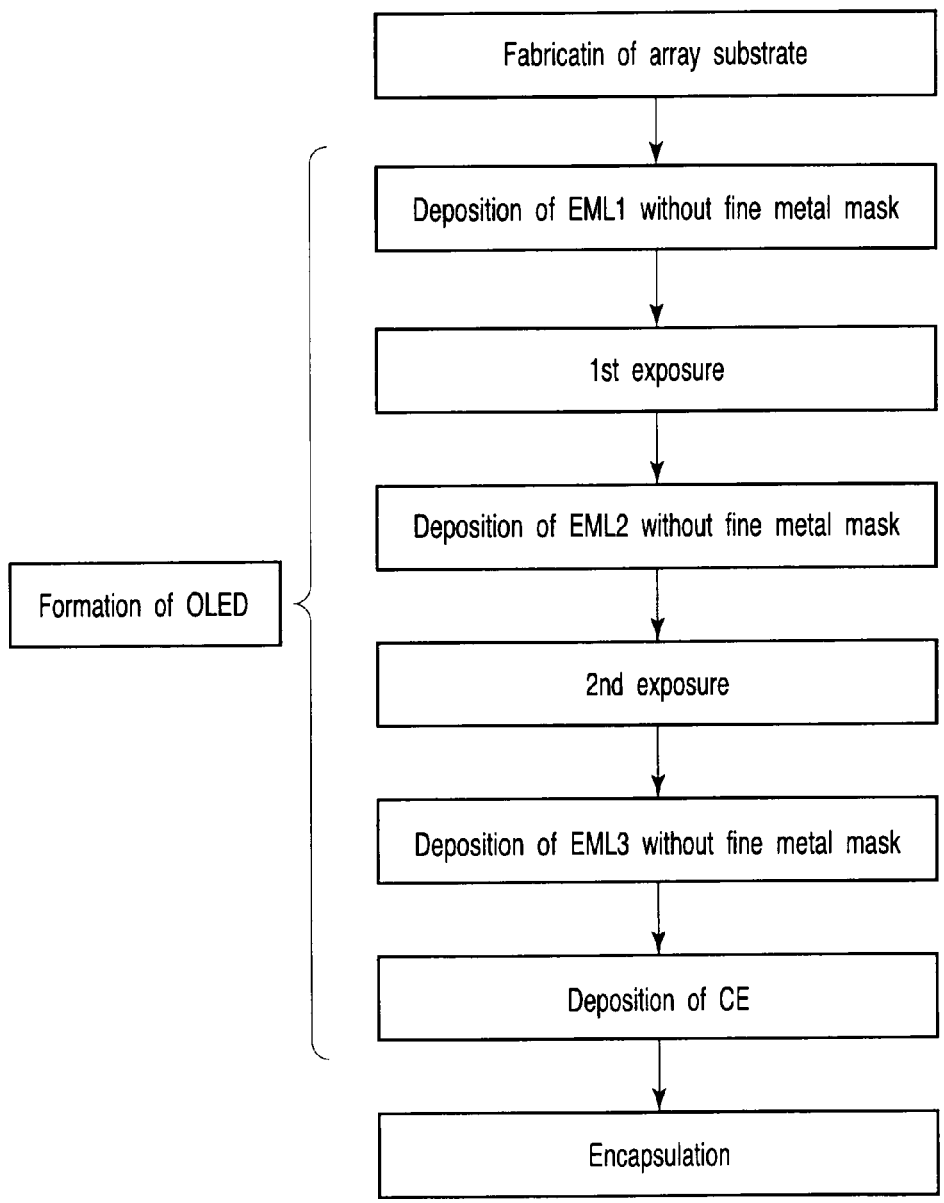
FIG. 5 is a flow chart showing an example of the manufacturing process for the display according to the first embodiment of the present invention.
Figure 6:
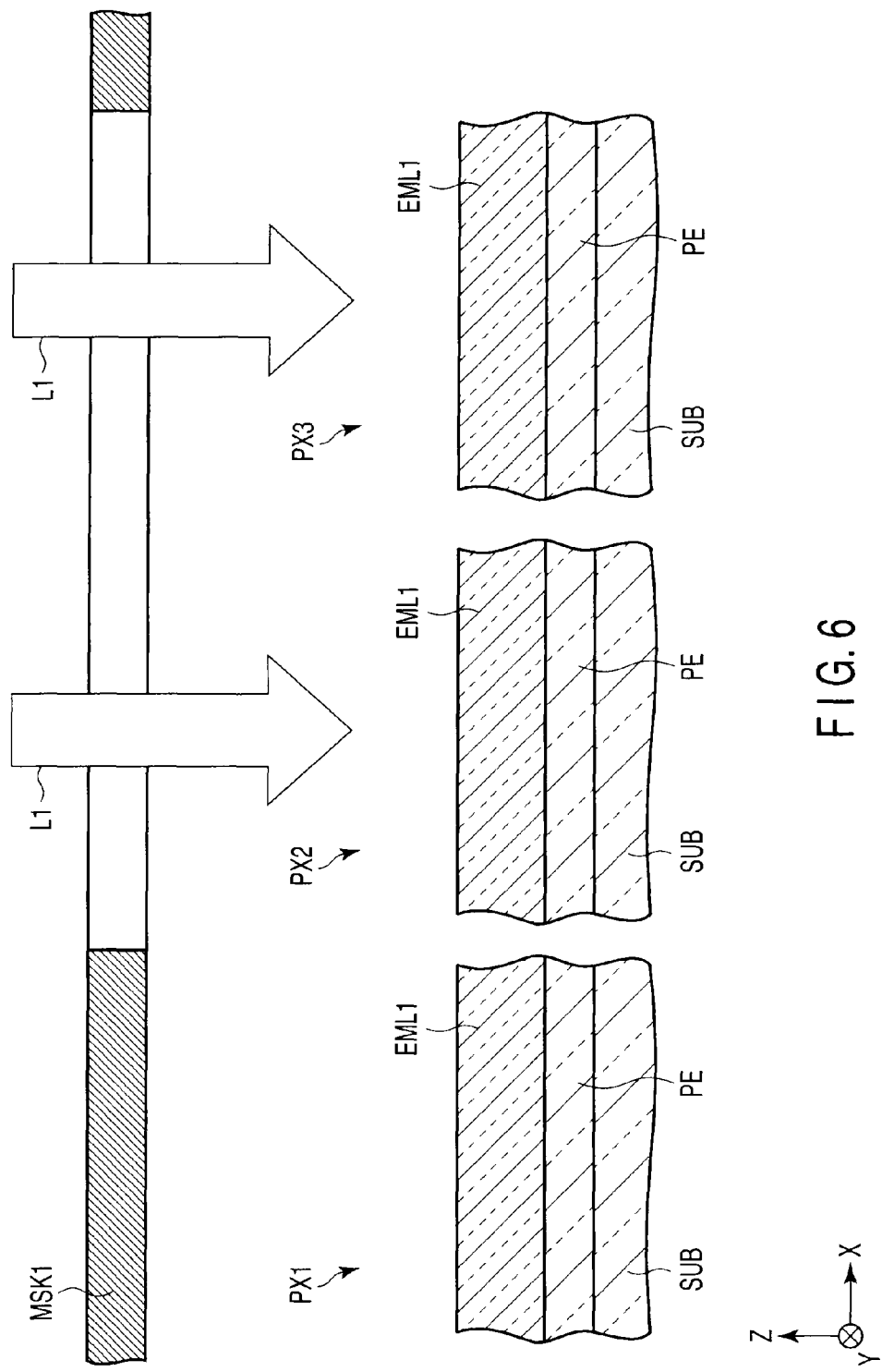
FIG. 6 is a sectional view schematically showing the first exposure performed in the manufacturing process shown in FIG. 5.
Figure 7:
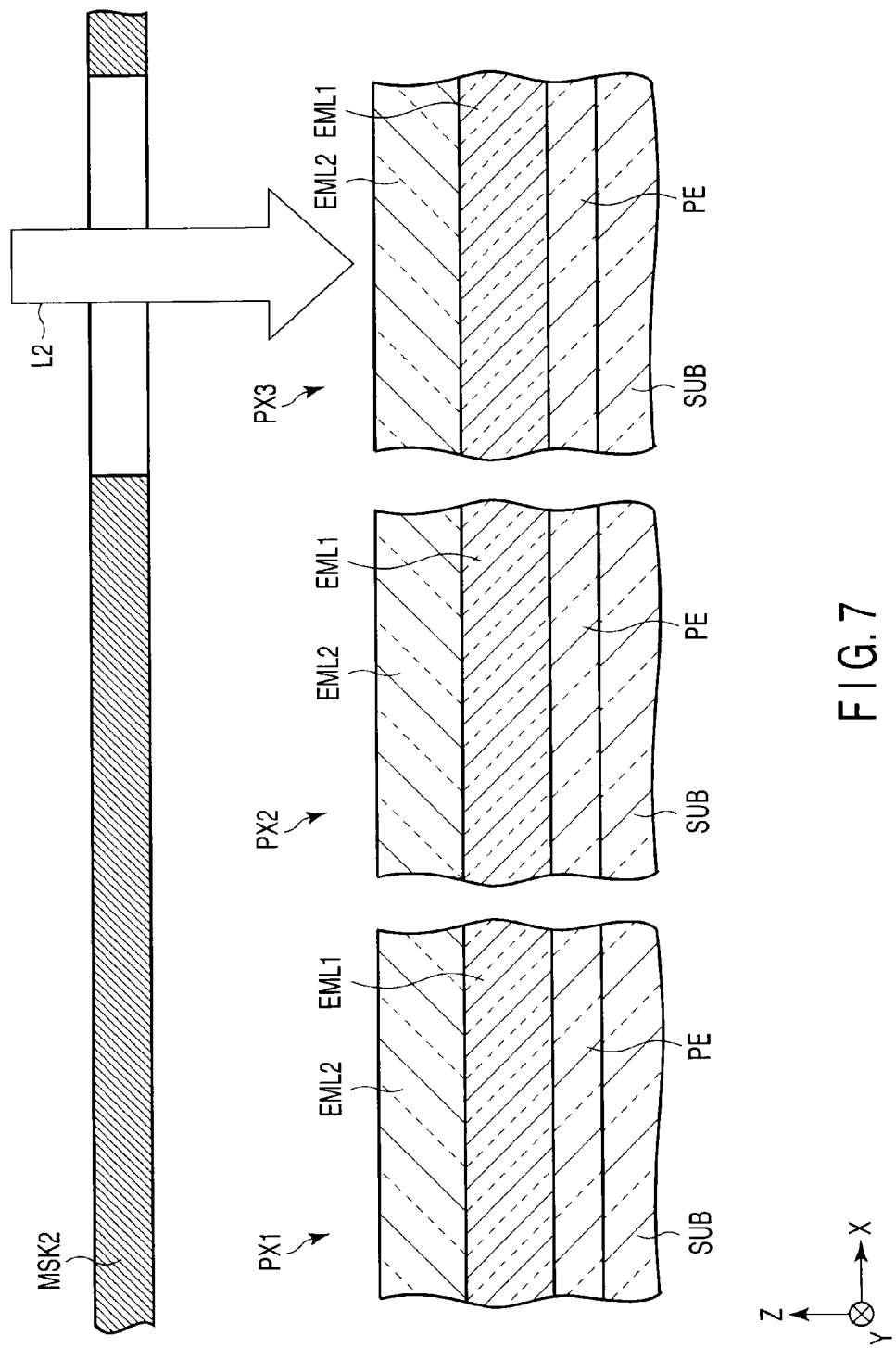
FIG. 7 is a sectional view schematically showing the second exposure performed in the manufacturing process shown in FIG. 5.

FIG. 5 is a flow chart showing an example of the manufacturing process for the display according to the first embodiment of the present invention. FIG. 6 is a sectional view schematically showing the first exposure performed in the manufacturing process shown in FIG. 5. FIG. 7 is a sectional view schematically showing the second exposure performed in the manufacturing process shown in FIG. 5.

According to the manufacturing process shown in FIG. 5, the array substrate is fabricated first. The array substrate has the same structure as that of the display described above except that the video signal line driver XDR, the scan signal line driver YDR, the sealing substrate SUB2, the sealing layer, the counter electrode CE and the organic layer ORG are omitted.

Next, the organic EL elements are formed by the following method.

First, the emitting layer EML1 is deposited on the pixel electrodes PE and the insulating partition layer PI. In other words, the first luminescent organic material as the material of the emitting layer EML1 is deposited on the pixel electrodes PE and the insulating partition layer PI. The first luminescent organic material is deposited on the pixel electrodes PE and the insulating partition layer PI by vacuum evaporation for example. In the vacuum evaporation, a fine metal mask provided with through-holes at positions corresponding to the pixels PX1 is not used. In the vacuum evaporation, a rough metal mask provided with an opening having dimensions corresponding to the display region may be used. Thus, the emitting layer EML1 is obtained as a continuous layer extending over the display region.

Subsequently, the first exposure is performed. Specifically, as shown in FIG. 6, using the photomask MSK1, the regions of the emitting layer EML1 that correspond to the pixels PX2 and PX3, for example, the regions of the emitting layer EML1 that correspond to the pixel electrodes PE of the pixels PX2 and PX3 are irradiated with the light L1 without irradiating the regions of the emitting layer EM1 that correspond to the pixels PX1, for example, the regions of the emitting layer EML1 that correspond to the pixel electrodes PE of the pixels PX1 with the light L1. By doing so, the first luminescent organic material in the irradiated regions is converted into a material different from the first luminescent organic material.

The first light L1 is, for example, ultraviolet light with wavelengths longer than about 200 nm and shorter than about 400 nm. The exposure power is set, for example, within a range of 0.001 to 1 $mW \cdot mm^{-2} \cdot nm^{-1}$.

Next, the emitting layer EML2 is deposited on the emitting layer EML1. In other words, the second luminescent organic material as the material of the emitting layer EML2 is deposited on the emitting layer EML1. The second luminescent organic material is deposited on the emitting layer EML1 by vacuum evaporation for example. In the vacuum evaporation, a fine metal mask provided with through-holes at positions corresponding to the pixels PX2 is not used. In the vacuum evaporation, the rough metal mask described above may be used. Thus, the emitting layer EML2 is obtained as a continuous layer extending over the display region.

Subsequently, the second exposure is performed. Specifically, as shown in FIG. 7, using the photomask MSK2, the regions of the emitting layer EML2 that correspond to the pixels PX3, for example, the regions of the emitting layer EML2 that correspond to the pixel electrodes PE of the pixels PX3 are irradiated with the light L2 without irradiating the regions of the emitting layer EM2 that correspond to the pixels PX1 and PX2, for example, the regions of the emitting layer EML2 that correspond to the pixel electrodes PE of the pixels PX1 and PX2 with the light L2. By doing so, the second luminescent organic material in the irradiated regions is converted into a material different from the second luminescent organic material.

The second light L2 is, for example, ultraviolet light with wavelengths longer than about 200 nm and shorter than about 400 nm. The exposure power is set, for example, within a range of 0.001 to 1 $mW \cdot mm^{-2} \cdot nm^{-1}$.

Next, the emitting layer EML3 is deposited on the emitting layer EML2. In other words, the third luminescent organic material as the material of the emitting layer EML3 is deposited on the emitting layer EML2. The third luminescent organic material is deposited on the emitting layer EML2 by vacuum evaporation for example. In the vacuum evaporation, a fine metal mask provided with through-holes at positions corresponding to the pixels PX3 is not used. In the vacuum evaporation, the rough metal mask described above may be used. Thus, the emitting layer EML3 is obtained as a continuous layer extending over the display region.

Subsequently, the counter electrode CE is deposited on the emitting layer EML3. The counter electrode CE is deposited on the emitting layer EML3 by vacuum evaporation for example. In the vacuum evaporation, the rough metal mask described above may be used. Thus, the counter electrode CE is obtained as a continuous layer extending over the display region.

Then, the organic EL elements OLED thus obtained are encapsulated. That is, the array substrate and the sealing substrate SUB2 are adhered to each other via the sealing layer such that the organic EL elements OLED are surrounded by the substrates SUB and SUB2 and the sealing layer.

Thereafter, the video signal line driver XDR and the scan signal line driver YDR are mounted to the display panel DP thus obtained. The organic EL display is thus obtained.

In this method, no fine metal mask is used in order to form the emitting layers EML1 to EML3. Instead, in this method, the photomasks are used or the photomasks and the rough metal mask are used in order to form the emitting layers EML1 to EML3.

A photomask can be manufactured at higher accuracies of pattern shape and pattern size as compared with a fine metal mask. Further, in a light exposure process using a photomask, the heat expansion or heat deformation of the photomask hardly occurs. In addition, the pattern size accuracy required of the rough metal mask is larger by one order or more than that required of the fine metal mask.

Thus, according to this method, even when the sizes of the pixels PX1 to PX3 are small, a high display quality and a high yield can be achieved.

In the case where fine metal masks are used for forming the emitting layers, evaporation materials are deposited on the masks to decrease the effective diameters of the through-holes formed in the masks. As a result, the deposition rates are lowered and much more evaporation materials must be used.

In the method described above, no fine metal mask is used. In addition, even when the evaporation materials are deposited on the rough metal mask, the above-described problem does not occur. Therefore, according to the method, a high productivity and a lower manufacturing cost can be achieved.

Note that the first and second exposures increase the hole mobilities and/or hole injection efficiencies of the emitting layers EML1 and EML2 at the irradiated regions. Alternatively, the first and second exposures decrease the electron mobilities and/or electron injection efficiencies of the emitting layers EML1 and EML2 at the irradiated regions. In this case, the same effect as described above can be achieved.

An example of the present embodiment will be described below.

In this example, the organic EL display described with reference to FIGS. 1 to 4 was manufactured by the same method as that described with reference to FIGS. 5 to 7.

Specifically, in the present example, under the following conditions, manufactured was a 3.0-inch WVGA organic EL display in which the dimensions of each of the pixels PX1 to PX3 were 82.5 μm×27.5 μm and the number of the pixels was 800×3×480.

As the pixel electrodes PE, ITO layers with a thickness of 50 nm were formed.

The emitting layer EML1 was deposited on the pixel electrodes PE and the insulating partition layer PI by vacuum evaporation using a rough metal mask. As the material of the emitting layer EML1, the mixture that contains a host material and a dopant material and emits red light was used. As the host material, tris(8-hydroxyquinolato)aluminum (hereinafter referred to as "$Alq_3$") was used. As the dopant material, 2-(1,1-dimethylethyl)-6(2-(2,3,6,7-tetrahydro-1,1,7,7-tetramethyl-1H,5H-benzo(ij)quinoridine-9-yl)ethenyl)-4H-pyran-4-ylidene)propanedinitrile (hereinafter referred to as "DCJTB") was used. The thickness of the emitting layer EML1 was 30 nm.

In the first exposure, the exposure power was set within a range of 0.001 to 1 $mW \cdot mm^{-2} \cdot nm^{-1}$. As the light L1, ultraviolet light with wavelengths longer than about 200 nm and shorter than about 400 nm was used.

The emitting layer EML2 was deposited on the emitting layer EML1 by vacuum evaporation using the rough metal mask. As the material of the emitting layer EML2, the mixture that contains a host material and a dopant material and emits green light was used. As the host material, $Alq_3$ was used. As the dopant material, Coumarine 6 was used. The thickness of the emitting layer EML2 was 30 nm.

In the first exposure, the exposure power was set within a range of 0.001 to 1 $mW \cdot mm^{-2} \cdot nm^{-1}$. The spectrum of the light L2 was the same as the spectrum of the light L1.

The emitting layer EML3 was deposited on the emitting layer EML2 by vacuum evaporation using the rough metal mask. As the material of the emitting layer EML3, the mixture that contains a host material and a dopant material and emits blue light was used. As the host material, 4,4'-bis(2,2'-diphenyl-ethene-1-yl)-diphenyl (hereinafter referred to as "BPVBI") was used. As the dopant material, perylene was used. The thickness of the emitting layer EML3 was 30 nm.

The counter electrode was deposited on the emitting layer EML3 by vacuum evaporation using the rough metal mask. As the material of the counter electrode CE, aluminum was used. The thickness of the counter electrode CE was 150 nm.

In this example, the display colors luminous efficiencies of the display thus manufactured were checked by the following method.

First, the display color and the luminous efficiency when viewed perpendicularly to the screen were checked while only the pixels PX1 were on. Here, the pixels PX1 were driven under the same conditions as that the reference white at the chromaticity coordinates of (0.31, 0.315) was displayed at a luminance of 100 $cd/cm^2$ when viewed perpendicularly to the screen. As a result, the display color was red at the chromaticity coordinates of (0.65, 0.35), and the luminous efficiency was 8 cd/A.

Next, the display color and the luminous efficiency when viewed perpendicularly to the screen were checked while only the pixels PX2 were on. Here, the pixels PX2 were driven under the same conditions as that the reference white at the chromaticity coordinates of (0.31, 0.315) was displayed at a luminance of 100 $cd/cm^2$ when viewed perpendicularly to the screen. As a result, the display color was green at the chromaticity coordinates of (0.30, 0.60), and the luminous efficiency was 10 cd/A.

Then, the display color and the luminous efficiency when viewed perpendicularly to the screen were checked while only the pixels PX3 were on. Here, the pixels PX1 were driven under the same conditions as that the reference white at the chromaticity coordinates of (0.31, 0.315) was displayed at a luminance of 100 $cd/cm^2$ when viewed perpendicularly to the screen. As a result, the display color was blue at the chromaticity coordinates of (0.14, 0.12), and the luminous efficiency was 3 cd/A.

COMPARATIVE EXAMPLE

Figure 8:
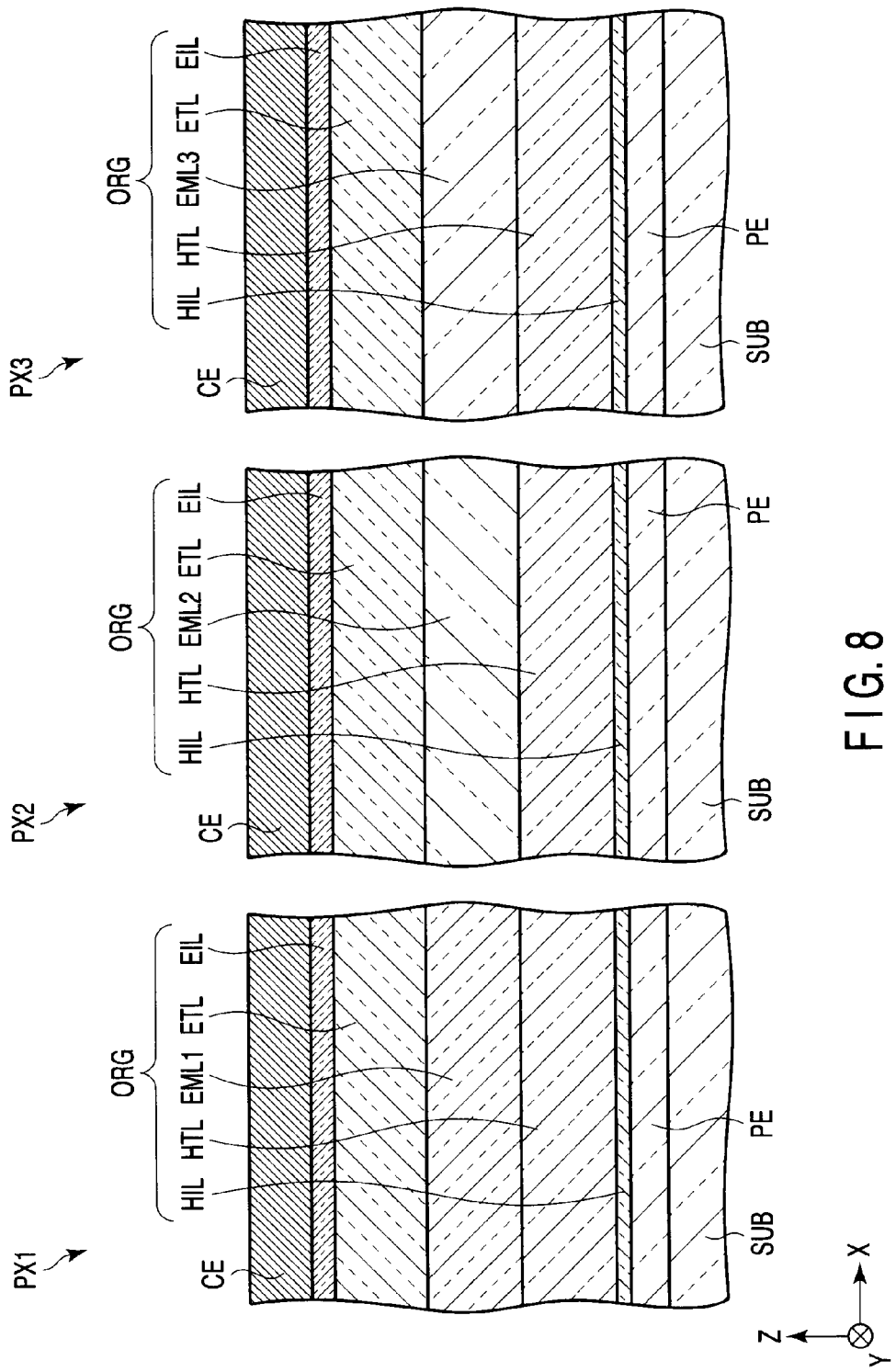
FIG. 8 is a sectional view showing the organic EL elements of the organic EL display according to a comparative example.

FIG. 8 is a sectional view showing the organic EL elements of the organic EL display according to a comparative example.

The display according to the comparative example is the same as the display described with reference to FIGS. 1 to 4 except that the structures shown in FIG. 8 are employed in the organic EL elements OLED of the pixels PX1 to PX3. As shown in FIG. 8, in this display, the organic layer ORG of each pixel PX1 includes a hole injection layer HIL, a hole-transporting layer HTL, the emitting layer EML1, an electron-transporting layer ETL and an electron injection layer EIL. The organic layer ORG of each pixel PX2 includes the hole injection layer HIL, the hole-transporting layer HTL, the emitting layer EML2, the electron-transporting layer ETL and the electron injection layer EIL. The organic layer ORG of each pixel PX3 includes the hole injection layer HIL, the hole-transporting layer HTL, the emitting layer EML3, the electron-transporting layer ETL and the electron injection layer EIL.

The emitting layer EML1 is not provided at the positions corresponding to the pixel electrodes of the pixels PX2 and PX3, but provided at the positions corresponding to the pixel electrodes of the pixels PX1. The emitting layer EML2 is not provided at the positions corresponding to the pixel electrodes of the pixels PX1 and PX3, but provided at the positions corresponding to the pixel electrodes of the pixels PX2. The emitting layer EML3 is not provided at the positions corresponding to the pixel electrodes of the pixels PX1 and PX2, but provided at the positions corresponding to the pixel electrodes of the pixels PX3.

The hole injection layer HIL is interposed between the pixel electrodes PE and the emitting layers EML1 to EML3. The hole-transporting layer HTL is interposed between hole injection layer HIL and the emitting layers EML1 to EML3. The electron injection layer EIL is interposed between the counter electrode CE and the emitting layers EML1 to EML3. The electron-transporting layer ETL is interposed between electron injection layer EIL and the emitting layers EML1 to EML3. Typically, each of the hole injection layer HIL, the hole-transporting layer HTL, the electron injection layer EIL and the electron-transporting layer ETL is a continuous layer extending over the display region.

The display is manufactured by the following method.

Figure 9:
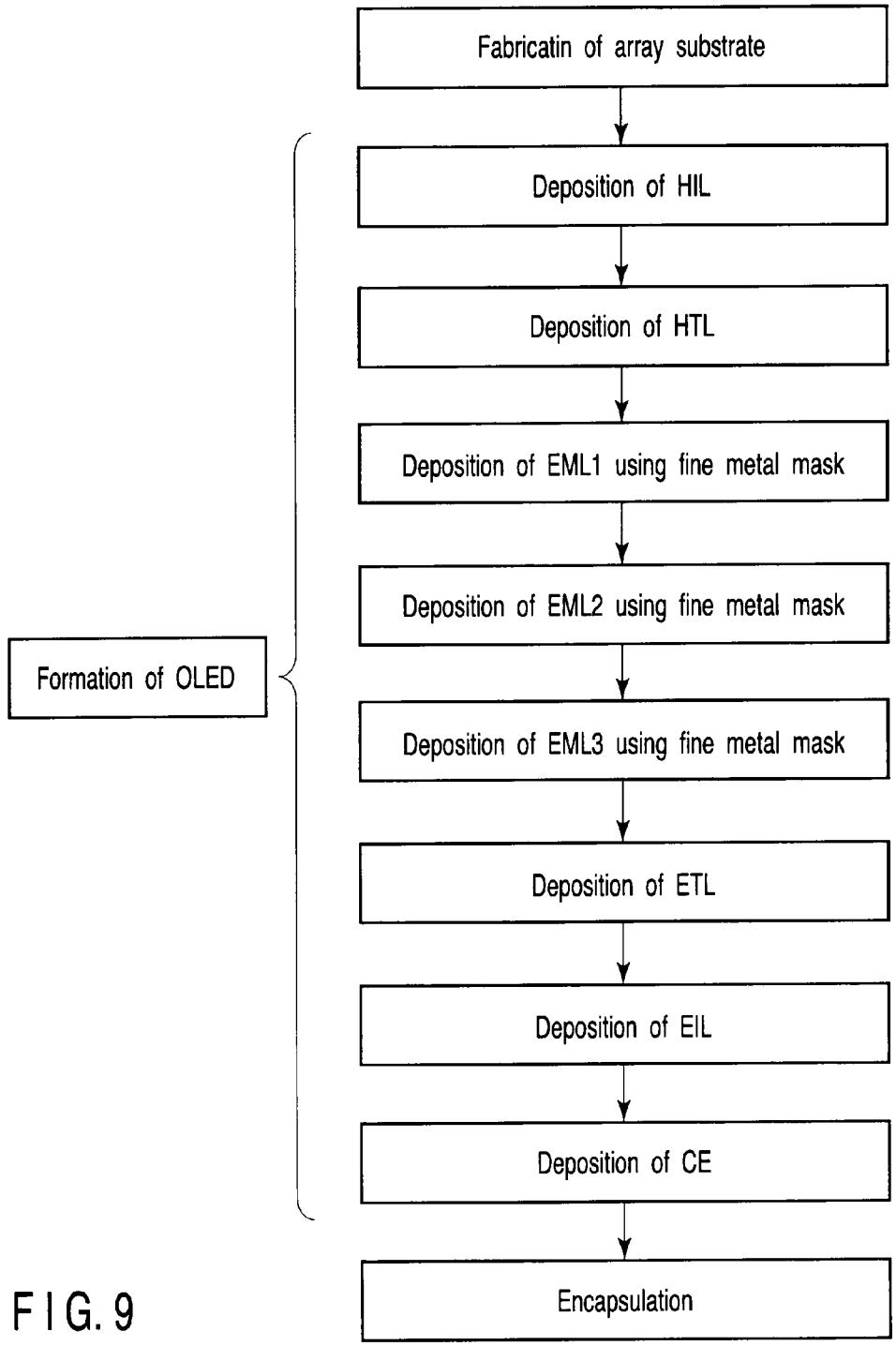
FIG. 9 is a flow chart showing the manufacturing process for the display according to the comparative example.

FIG. 9 is a flow chart showing the manufacturing process for the display according to the comparative example.

According to this manufacturing process, the array substrate is fabricated first, and subsequently, the organic EL elements are formed by the following method.

First, the hole injection layer HIL and the hole-transporting layer HTL are deposited on the pixel electrodes PE and the insulating partition layer PI in this order by vacuum evaporation. In the vacuum evaporation, a fine metal mask provided with through-holes at positions corresponding to the pixels is not used, and a rough metal mask provided with an opening having dimensions corresponding to the display region is used. Thus, each of the hole injection layer HIL and the hole-transporting layer HTL is obtained as a continuous layer extending over the display region.

Next, the emitting layers EML1 to EML3 are formed by the following method.

First, the emitting layer EML1 is deposited on the hole-transporting layer HTL by vacuum evaporation using a fine metal mask. The fine metal mask is provided with through-holes at positions corresponding to the pixel electrodes PE of the pixels PX1. Thus, the emitting layer EML1 having a thickness of 30 nm, for example is obtained as a patterned layer placed on the hole-transporting layer HTL at positions corresponding the pixel electrodes PE of the pixels PX1.

Next, the emitting layer EML2 is deposited on the hole-transporting layer HTL by vacuum evaporation using a fine metal mask. The fine metal mask is provided with through-holes at positions corresponding to the pixel electrodes PE of the pixels PX2. Thus, the emitting layer EML2 having a thickness of 30 nm, for example is obtained as a patterned layer placed on the hole-transporting layer HTL at positions corresponding the pixel electrodes PE of the pixels PX2.

Then, the emitting layer EML3 is deposited on the hole-transporting layer HTL by vacuum evaporation using a fine metal mask. The fine metal mask is provided with through-holes at positions corresponding to the pixel electrodes PE of the pixels PX3. Thus, the emitting layer EML3 having a thickness of 30 nm, for example is obtained as a patterned layer placed on the hole-transporting layer HTL at positions corresponding the pixel electrodes PE of the pixels PX3.

Then, the electron-transporting layer ETL and the electron injection layer EIL are deposited on the emitting layers EML1 to EML3 in this order by vacuum evaporation. In the vacuum evaporation, a fine metal mask provided with through-holes at positions corresponding to the pixels is not used, and a rough metal mask provided with an opening having dimensions corresponding to the display region is used. Thus, each of the electron-transporting layer EIL and the electron injection layer EIL is obtained as a continuous layer extending over the display region.

Subsequently, the counter electrode CE is deposited on the electron injection layer EIL by vacuum evaporation for example. In the vacuum evaporation, the fine metal mask is not used, and the rough metal is used. Thus, the counter electrode CE is obtained as a continuous layer extending over the display region.

Then, the organic EL elements OLED thus obtained are encapsulated by the same method as described with reference to FIG. 5. Further, the video signal line driver XDR and the scan signal line driver YDR are mounted to the display panel DP thus obtained. The organic EL display is thus obtained.

In this method, the emitting layers EML1 to EML3 are formed by vacuum evaporation using the fine metal masks. A fine metal mask is lower in accuracies of pattern shape and pattern size than a photomask. In addition, the fine metal mask expands or is deformed due to the radiant heat from the evaporation source.

For these reasons, the emitting layers EML1 to EML3 are difficult to form at high position accuracies. That is, according to this method, displacements of the emitting layers EML1 to EML3 are prone to occur. When the emitting layer EML1 and the emitting layer EML2 or EML3 are formed at positions of the pixel electrodes of the pixels PX1, for example, the color mixture of red color and green or blue color occurs.

Further, according to this method, the insulating partition layer PI is utilized as a spacer that prevents the fine metal masks from coming into contact with the regions of the emitting layers EML1 to EML3 corresponding to the pixel electrodes PE. When the fine metal masks come into contact with either of the emitting layers EML1 to EML3, a defect may be produced in the emitting layer. In this case, it is possible that the pixel electrode PE and the counter electrode CE establish a short circuit to cause a dark spot.

Therefore, according to the method, the insulating partition layer PI must be formed thick. For preventing the fine metal masks from coming into contact with either of the emitting layers EML1 to EML3, the thickness of the insulating partition layer PI should be 1 μm or more, for example.

Second Embodiment

The organic EL display according to the second embodiment is the same as the organic EL display according to the first embodiment. The second embodiment is different in the manufacturing process of the display from the first embodiment.

Figure 10:
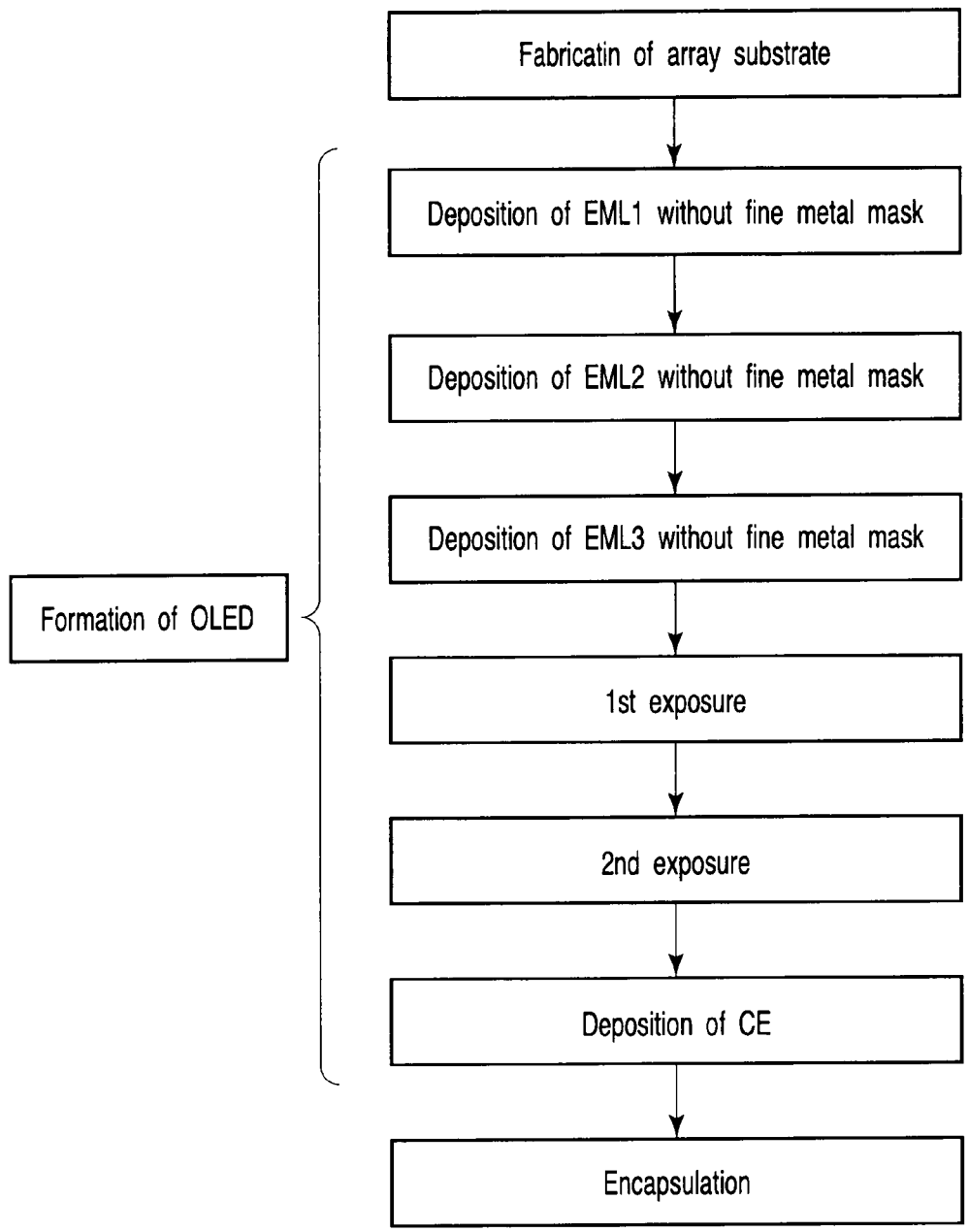
FIG. 10 is a flow chart showing an example of the manufacturing process for the display according to the second embodiment of the present invention.

FIG. 10 is a flow chart showing an example of the manufacturing process for the display according to the second embodiment of the present invention.

According to the manufacturing process shown in FIG. 10, the array substrate is fabricated first.

Next, the organic EL elements are formed by the following method.

First, the emitting layer EML1 is deposited on the pixel electrodes PE and the insulating partition layer PI by the same method as described with reference to FIG. 5. Subsequently, the emitting layer EML2 is deposited on the first emitting layer EML1 by the same method as described with reference to FIG. 5. Then, the emitting layer EML3 is deposited on the first emitting layer EML2 by the same method as described with reference to FIG. 5. That is, the first to third luminescent organic materials are deposited on the pixel electrodes PE and the insulating partition layer PI in this order without performing the first and second exposures.

Next, the first exposure is performed. This first exposure is the same as the first exposure described with reference to FIGS. 5 and 6 except that it is performed after the depositions of the emitting layers EML2 and EML3 using the light L1 described below.

The light L1 used for the first exposure is the light that the dopant material of the first luminescent organic material exhibits a higher absorptance as compared with the dopant materials of the second and third luminescent organic materials. For example, among the dopant materials of the first to third luminescent organic materials, only the dopant material of the first luminescent organic material can absorb light with a wavelength equal to the dominant wavelength of the light L1. Typically, the light L1 is ultraviolet light.

Subsequently, the second exposure is performed. This second exposure is the same as the second exposure described with reference to FIGS. 5 and 6 except that it is performed after the deposition of the emitting layer EML3 using the light L2 described below.

The light L2 used for the second exposure is the light that the dopant material of the second luminescent organic material exhibits a higher absorptance as compared with the dopant materials of the first and third luminescent organic materials. For example, among the dopant materials of the first to third luminescent organic materials, only the dopant material of the second luminescent organic material can absorb light with a wavelength equal to the dominant wavelength of the light L2. Typically, the light L2 is ultraviolet light.

Subsequently, the counter electrode CE is deposited on the emitting layer EML3 by the same method as described with reference to FIG. 5. Thus, the organic EL elements are obtained.

Then, the organic EL elements OLED are encapsulated by the same method as described with reference to FIG. 5. Further, the video signal line driver XDR and the scan signal line driver YDR are mounted to the display panel DP thus obtained. The same organic EL display as described with reference to FIGS. 1 to 4 is thus obtained.

In this manufacturing process, the first and second exposures are performed after the depositions of the emitting layers EML1 to EML3. Thus, in the case where the process shown in FIG. 10 is employed, the number of carrying the substrate SUB into the vacuum evaporation apparatus or the number of carrying out the substrate SUB from the vacuum evaporation apparatus can be decreased as compared with the case where the process shown in FIG. 5 is employed. Consequently, when the process shown in FIG. 10 is employed, the time required for carrying the substrate SUB and the time required for exhausting gas from the apparatus can be decreased. Therefore, in the case where the process shown in FIG. 10 is employed, a higher productivity can be achieved as compared with the case where the process shown in FIG. 5 is employed.

In this manufacturing process, the first exposure may be performed after the deposition of the emitting layer EML2 before depositing the emitting layer EML3. In this case, the second exposure may be performed after the first exposure before depositing the emitting layer EML3. Alternatively, the second exposure may be performed after depositing the emitting layer EML3.

When the first exposure is performed before depositing the emitting layer EML3, it is not necessary to consider the absorption of light L1 by the emitting layer EML3. When the second exposure is performed before depositing the emitting layer EML3, it is not necessary to consider the absorption of light L2 by the emitting layer EML3.

Third Embodiment

Figure 11:
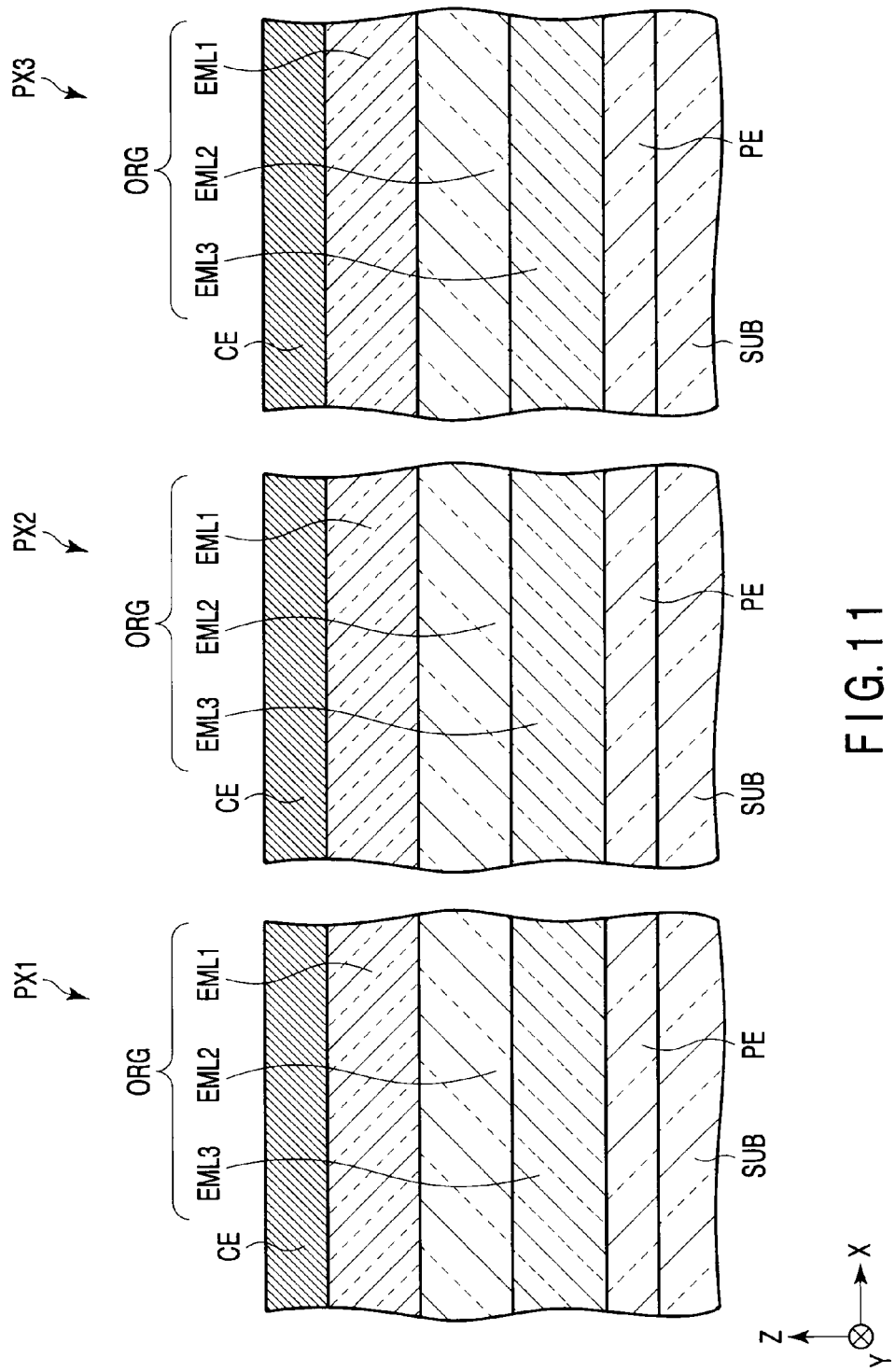
FIG. 11 is a sectional view schematically showing the organic EL elements of the organic EL display according to the third embodiment of the present invention.

FIG. 11 is a sectional view schematically showing the organic EL elements of the organic EL display according to the third embodiment of the present invention.

The display according to the third embodiment is the same as the display according to the first embodiment except that the following structure is employed. That is, as is apparent from the comparison between the structures shown in FIGS. 3 and 11, the display according to the third embodiment is different in the sequence of the emitting layers EML1 to EML3 from the display according to the first embodiment. In addition, the display according to the third embodiment employs the following structures in the emitting layers EML1 to EML3.

In the pixels PX1, the emitting layer EML3 is better in the electron/hole injection balances than the emitting layers EML1 and EML2. Further, in the pixels PX1, the absorption spectra of the dopant materials in the emitting layers EML1 and EML2 do not overlap the emission spectrum of the emitting layer EML3. Alternatively, the overlap is sufficiently small.

Thus, in the pixels PX1, the recombination of electrons and holes mainly occurs in the emitting layer EML3. In addition, in the pixels PX1, the light emitted by the emitting layer EML3 is hardly converted into the lights having the same spectra as the emission spectra of the dopant materials in the emitting layers EML1 and EML2. Therefore, the emission color of the pixels PX1 is almost the same as the emission color of the emitting layer EML3. For example, the pixels PX1 emit blue light.

In the pixels PX2, most of the dopant material in the emitting layer EML3 is quenched or is not excited. In addition, in the pixels PX2, the emitting layer EML2 is better in the electron/hole injection balances than the emitting layers EML1 and EML3. Further, in the pixels PX2, the absorption spectrum of the dopant material in the emitting layer EML1 does not overlap the emission spectrum of the emitting layer EML2. Alternatively, the overlap is sufficiently small.

Thus, in the pixels PX2, the recombination of electrons and holes mainly occurs in the emitting layer EML2. In addition, in the pixels PX2, the light emitted by the emitting layer EML2 is hardly converted into the lights having the same spectra as the emission spectra of the dopant materials in the emitting layers EML1 and EML3. Therefore, the emission color of the pixels PX2 is almost the same as the emission color of the emitting layer EML2. For example, the pixels PX2 emit green light.

In the pixels PX3, most of the dopant materials in the emitting layers EML2 and EML3 are quenched or are not excited. In addition, in the pixels PX3, the emitting layer EML3 is better in the electron/hole injection balances than the emitting layers EML1 and EML2.

Thus, in the pixels PX3, the recombination of electrons and holes mainly occurs in the emitting layer EML3. In addition, in the pixels PX3, the light emitted by the emitting layer EML3 is hardly converted into the lights having the same spectra as the emission spectra of the dopant materials in the emitting layers EML1 and EML2. Therefore, the emission color of the pixels PX3 is almost the same as the emission color of the emitting layer EML3. For example, the pixels PX3 emit red light.

Thus, when the structure described above is employed, the pixels PX1 to PX3 emit lights different in colors from one another.

Figure 12:
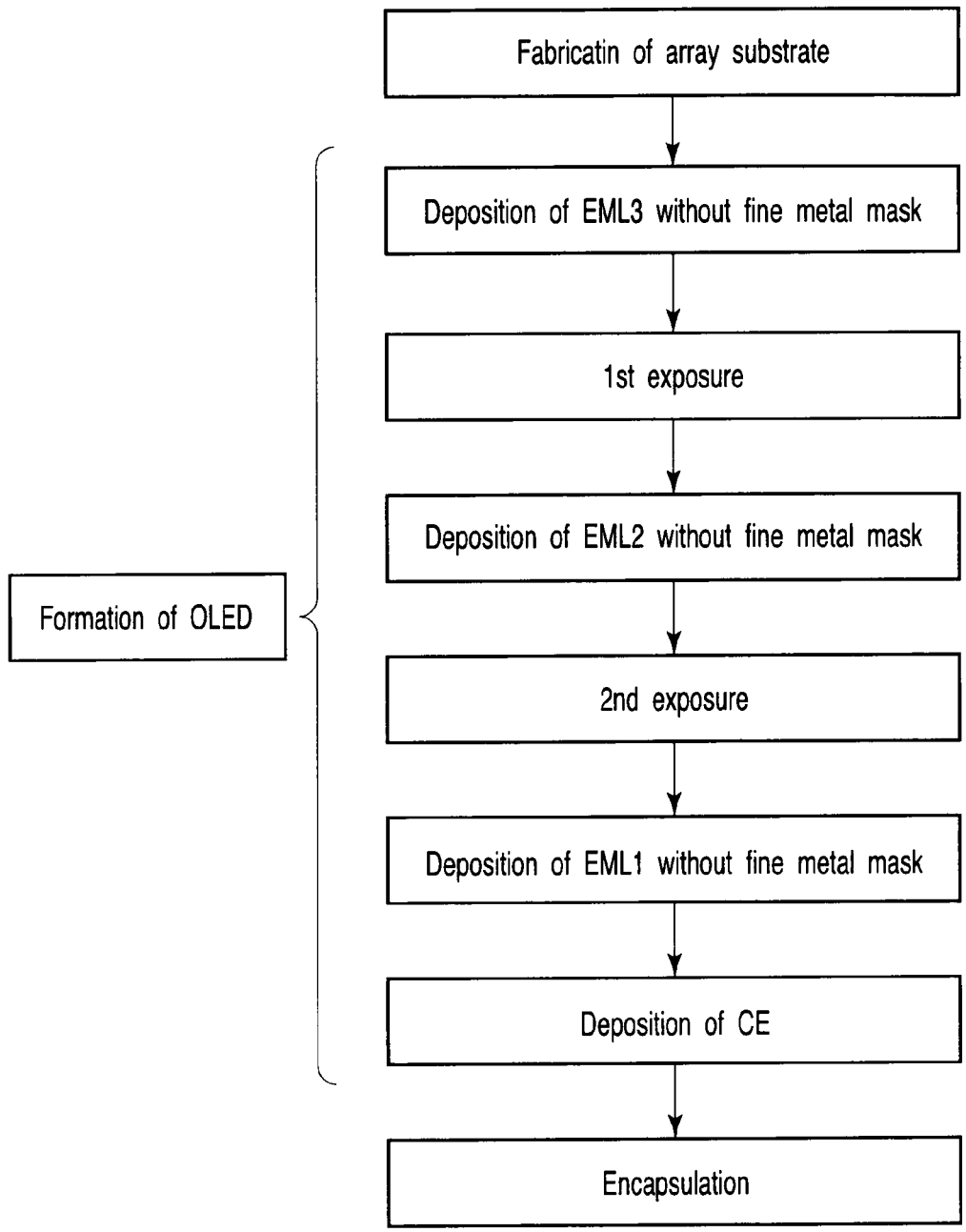
FIG. 12 is a flow chart showing an example of the manufacturing process for the display according to the third embodiment of the present invention.

FIG. 12 is a flow chart showing an example of the manufacturing process for the display according to the third embodiment of the present invention. As is apparent from the comparison between the processes shown in FIGS. 5 and 12, this display can be manufactured by the same method as described with reference to FIGS. 5 to 7 except that the deposition of the emitting layer EML3 and the deposition of the emitting layer EML1 are performed instead of the deposition of the emitting layer EML1 and the deposition of the emitting layer EML3, respectively.

Fourth Embodiment

Figure 13:
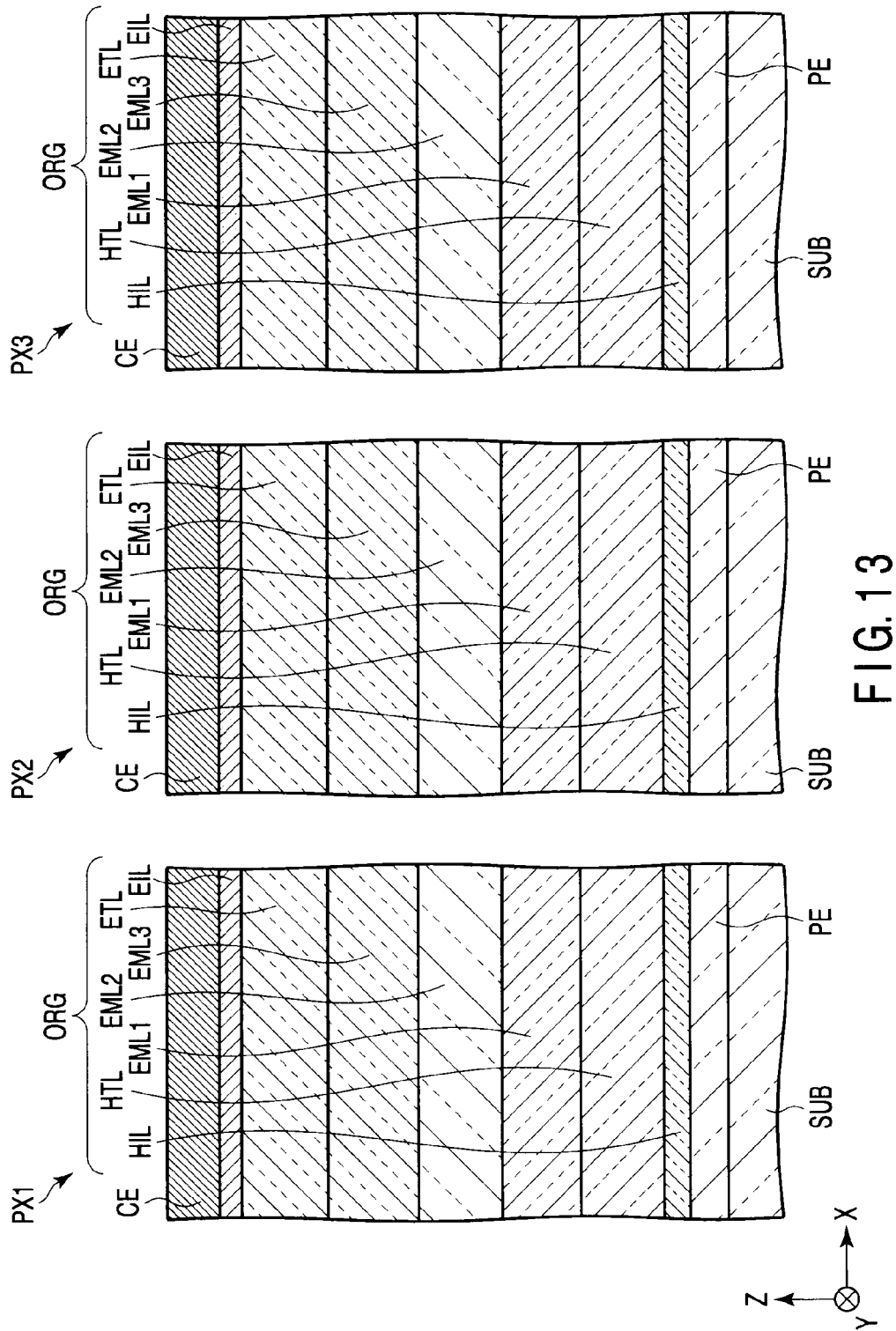
FIG. 13 is a sectional view schematically showing the organic EL elements of the organic EL display according to the fourth embodiment of the present invention.

FIG. 13 is a sectional view schematically showing the organic EL elements of the organic EL display according to the fourth embodiment of the present invention.

The display according to the fourth embodiment is the same as the display according to the first embodiment except that the following structure is employed. That is, in the display according to the fourth embodiment, each of the organic layers ORG of the pixels PX1 to PX3 includes the hole injection layer HIL, the hole-transporting layer HTL, the electron injection layer HIL and the electron-transporting layer HTL in addition to the emitting layers EML1 to EML3.

The hole injection layer HIL is interposed between the pixel electrodes PE and the emitting layer EML1. The hole-transporting layer HTL is interposed between the hole injection layer HIL and the emitting layer EML1. The electron injection layer HIL is interposed between the counter electrode CE and the emitting layer EML3. The electron-transporting layer ETL is interposed between the electron injection layer HIL and the emitting layer EML3. Typically, each of the hole injection layer HIL, the hole-transporting layer HTL, the electron injection layer HIL and the electron-transporting layer HTL is a continuous layer extending over the display region.

When such a structure is employed, the electron/hole injection balance of either of the emitting layers EML1 to EML3 is improved in each of the pixels PX1 to PX3. As a result, the emission efficiency is increased. In addition, charge injecting and transporting efficiencies are increased. Thus, it is possible to lower the drive voltage.

Figure 14:
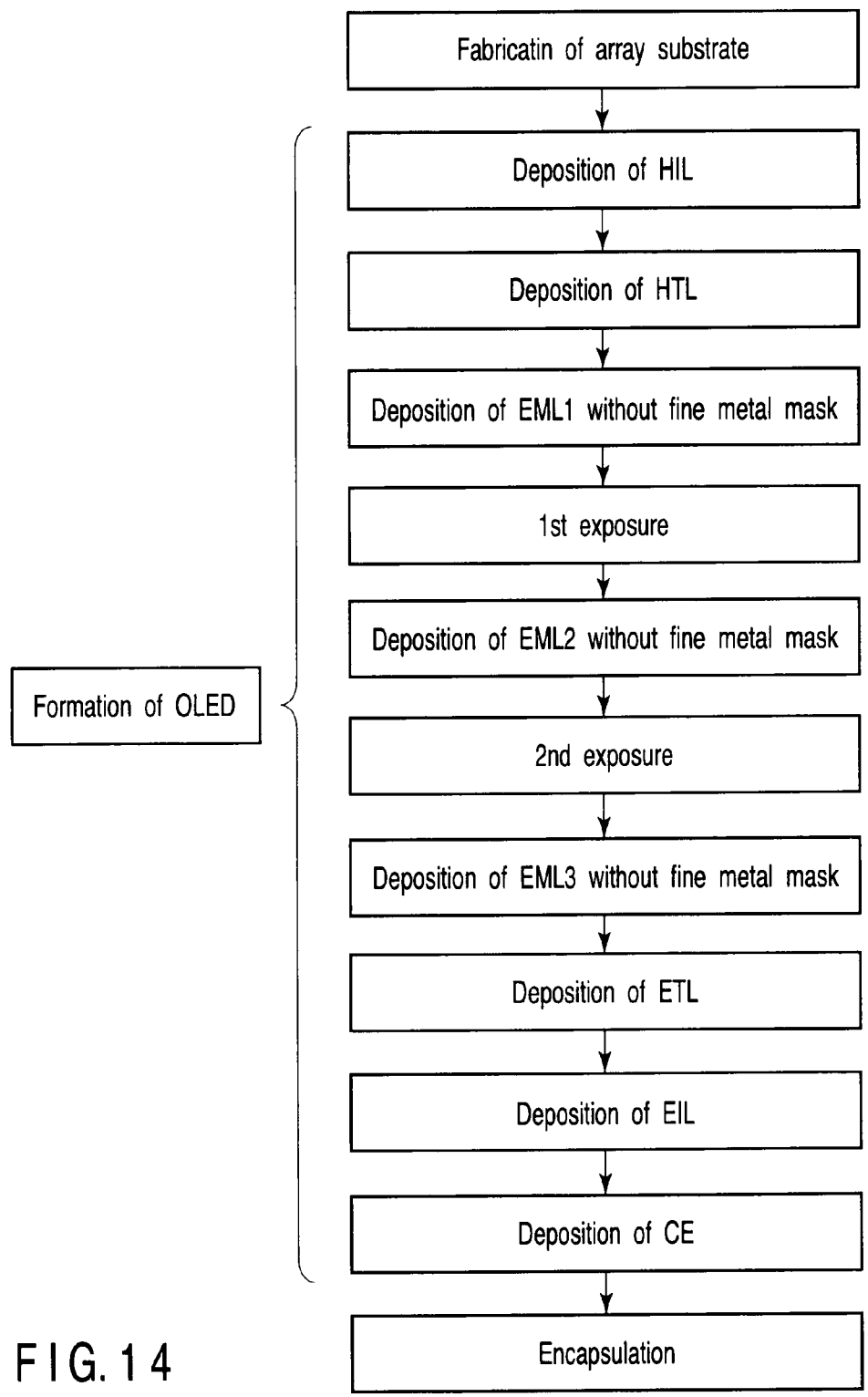
FIG. 14 is a flow chart showing an example of the manufacturing process for the display according to the fourth embodiment of the present invention.

FIG. 14 is a flow chart showing an example of the manufacturing process for the display according to the fourth embodiment of the present invention.

According to this manufacturing process, the array substrate is fabricated first, and subsequently, the organic EL elements are formed by the following method.

First, the hole injection layer HIL and the hole-transporting layer HTL are deposited on the pixel electrodes PE and the insulating partition layer PI in this order, for example, by vacuum evaporation. In the vacuum evaporation, a fine metal mask provided with through-holes at positions corresponding to the pixels is not used. In the vacuum evaporation, a rough metal mask provided with an opening having dimensions corresponding to the display region may be used. Thus, each of the hole injection layer HIL and the hole-transporting layer HTL is obtained as a continuous layer extending over the display region.

As the hole injection layer HIL, for example, an amorphous carbon layer with a thickness of 10 nm is formed by vacuum evaporation. As the hole-transporting layer HTL, for example, a layer with a thickness of 30 nm made of N,N'-diphenyl-N,N'-bis(1-naphtylphenyl)-1,1'-biphenyl-4,4'-diamine, i.e., α-NPD is formed by vacuum evaporation.

Next, the emitting layers EML1 to EML3 are formed by the same method as described with reference to FIGS. 5 to 7.

As the host material and the dopant material of the emitting layer EML1, for example, $Alq_3$ and DCJTB are used, respectively. The thickness of the emitting layer EML1 is, for example, 30 nm. In the first exposure, for example, ultraviolet light with wavelengths longer than about 200 nm and shorter than about 400 nm is used and the exposure power is set within a range of 0.001 to 1 $mW \cdot mm^{-2} \cdot nm^{-1}$.

As the host material and the dopant material of the emitting layer EML2, for example, $Alq_3$ and Coumarine 6 are used, respectively. The thickness of the emitting layer EML2 is, for example, 30 nm. In the second exposure, for example, light having the same spectrum as that of the light used in the first exposure is used and the exposure power is set within a range of 0.001 to 1 $mW \cdot mm^{-2} \cdot nm^{-1}$.

As the host material and the dopant material of the emitting layer EML3, for example, BPVBI and perylene are used, respectively. The thickness of the emitting layer EML3 is, for example, 30 nm.

Then, the electron-transporting layer ETL and the electron injection layer EIL are deposited on the emitting layer EML3 in this order, for example, by vacuum evaporation. In the vacuum evaporation, a fine metal mask provided with through-holes at positions corresponding to the pixels is not used. In the vacuum evaporation, a rough metal mask provided with an opening having dimensions corresponding to the display region may be used. Thus, each of the electron-transporting layer EIL and the electron injection layer EIL is obtained as a continuous layer extending over the display region.

As the electron-transporting layer ETL, for example, an $Alq_3$ layer with a thickness of 30 nm is formed by vacuum evaporation. As the electron injection layer EIL, for example, a lithium fluoride layer with a thickness of 1 nm is formed by vacuum evaporation.

Subsequently, the counter electrode CE is deposited on the electron injection layer EIL by vacuum evaporation for example. In the vacuum evaporation, the fine metal mask is not used. In the vacuum evaporation, the rough metal may be used. Thus, the counter electrode CE is obtained as a continuous layer extending over the display region.

As the material of the counter electrode CE, for example, aluminum is used. The thickness of the counter electrode CE is, for example, 150 nm.

Then, the organic EL elements OLED thus obtained are encapsulated by the same method as described with reference to FIG. 5. Further, the video signal line driver XDR and the scan signal line driver YDR are mounted to the display panel DP thus obtained. The organic EL display is thus obtained.

Fifth Embodiment

Figure 15:
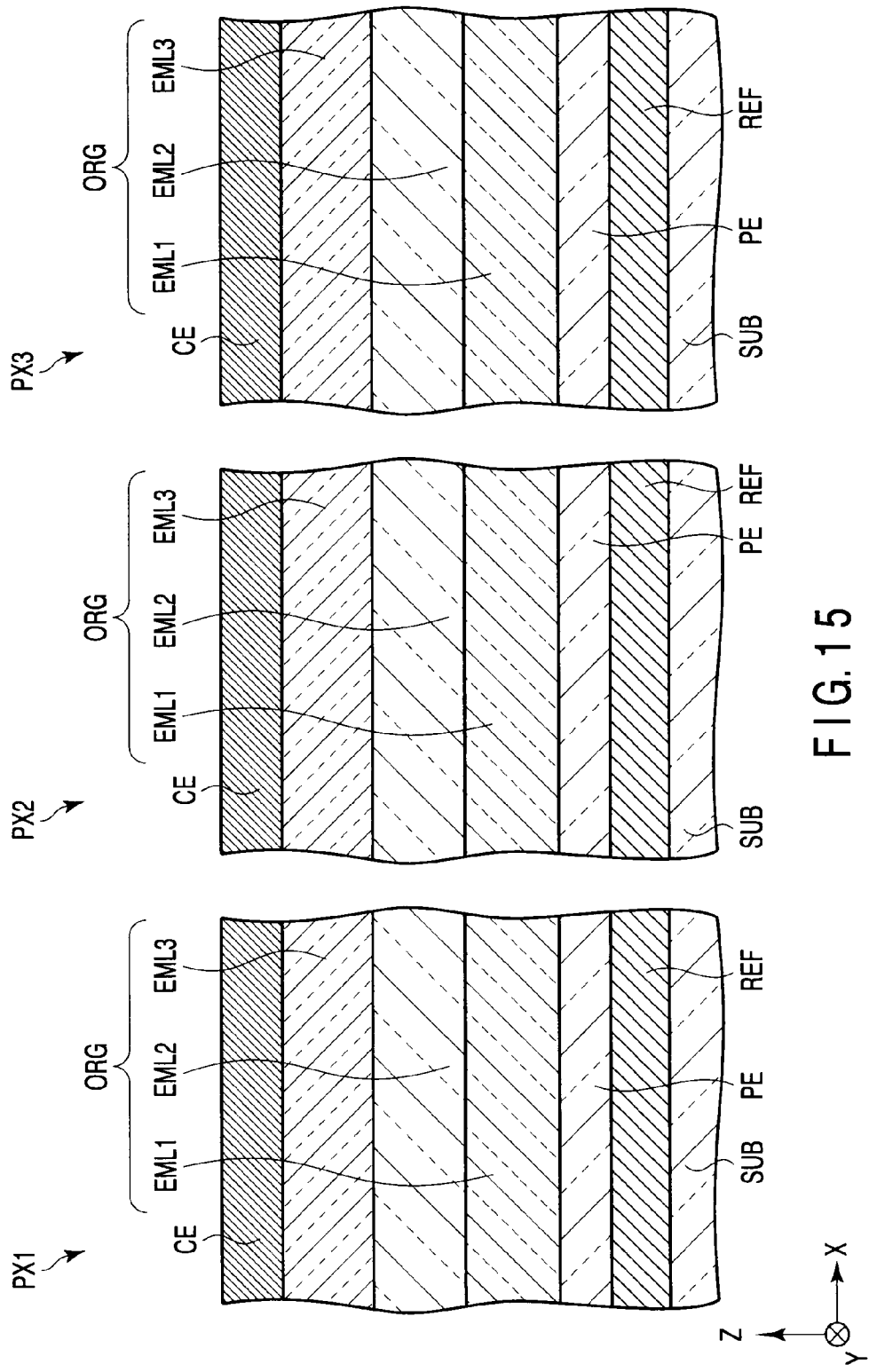
FIG. 15 is a sectional view schematically showing the organic EL elements of the organic EL display according to the fifth embodiment of the present invention.

FIG. 15 is a sectional view schematically showing the organic EL elements of the organic EL display according to the fifth embodiment of the present invention.

The display according to the fifth embodiment is the same as the display according to the first embodiment except that the following structure is employed. That is, as shown in FIG. 15, the display according to the fifth embodiment further includes the reflective layer REF interposed between the substrate SUB and the pixel electrodes PE. In addition, in this display, the counter electrode CE has a light-transmitting property. In short, the organic EL display according to the fifth embodiment is top emission display.

In the top emission display, the substrate SUB need not have a light-transmitting property.

The reflective layer REF is made of metal or alloy, for example. As the material of the reflective layer REF, for example, aluminum or aluminum alloy is used.

As the counter electrode CE, for example, a semitransparent electrode is used. The semitransparent electrode can be formed, for example, by the simultaneous deposition of magnesium and silver. In this case, when the content of the silver set at about 60% to about 98% and the thickness is set at about 20 nm, an excellent light-transmitting property can be achieved.

In the top emission display, the thin-film transistors and the wirings do not affect the aperture ratio in contrast to the bottom emission display. Thus, in the top emission display, the area ratio of emitting portions in the display region can be increased as compared with the bottom emission display. Therefore, according to the present embodiment, a sufficient luminance can be achieved even in the case where the current densities of the organic EL elements OLED are small. Accordingly, a long lifetime can be achieved.

This display can be manufactured by the same method as described with reference to FIGS. 5 to 7 or by the same method as described with reference to FIG. 10 except that the reflective layer REF is further formed before forming the pixel electrodes PE and the counter electrode CE is formed as a layer having a light-transmitting property.

Sixth Embodiment

Figure 16:
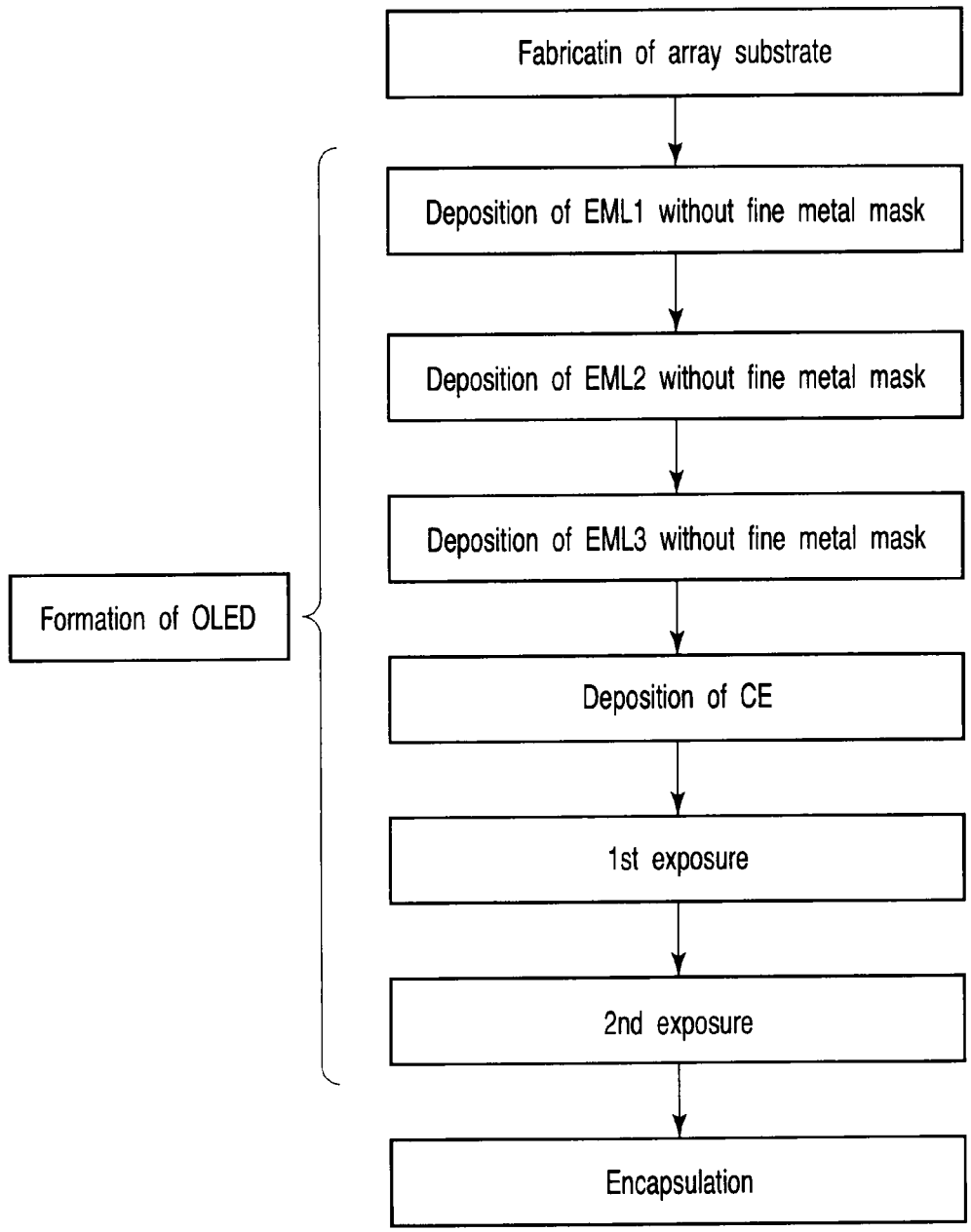
FIG. 16 is a flow chart showing an example of the manufacturing process for the display according to the sixth embodiment of the present invention.

FIG. 16 is a flow chart showing an example of the manufacturing process for the display according to the sixth embodiment of the present invention.

In the present embodiment, the top emission display according to the fifth embodiment is manufactured by the method shown in FIG. 16. That is, the first and second exposures are performed after depositing the counter electrode CE.

In the first and second exposures, in most cases, the emitting layer EML1 or EML2 is not irradiated with light through the substrate SUB. Thus, in the manufacturing process for the bottom emission display whose counter electrode CE is impervious to light, the first and second exposures are performed before depositing the counter electrode CE in most cases.

As described above, in the display according to the present embodiment, the counter electrode CE has a light-transmitting property. Thus, as shown in FIG. 16, the first and second exposures can be performed after the deposition of the counter electrode CE.

In the case where the first and second exposures are performed after the deposition of the counter electrode CE, the number of carrying the substrate SUB into the vacuum evaporation apparatus or the number of carrying out the substrate SUB from the vacuum evaporation apparatus can be decreased as compared with the case where the process shown in FIG. 5 or the process shown in FIG. 10 is employed. Consequently, when the process shown in FIG. 16 is employed, the time required for carrying the substrate SUB and the time required for exhausting gas from the apparatus can be decreased. Therefore, in the case where the process shown in FIG. 16 is employed, a higher productivity can be achieved as compared with the case where the process shown in FIG. 5 or the process shown in FIG. 10 is employed.

Seventh Embodiment

Figure 17:
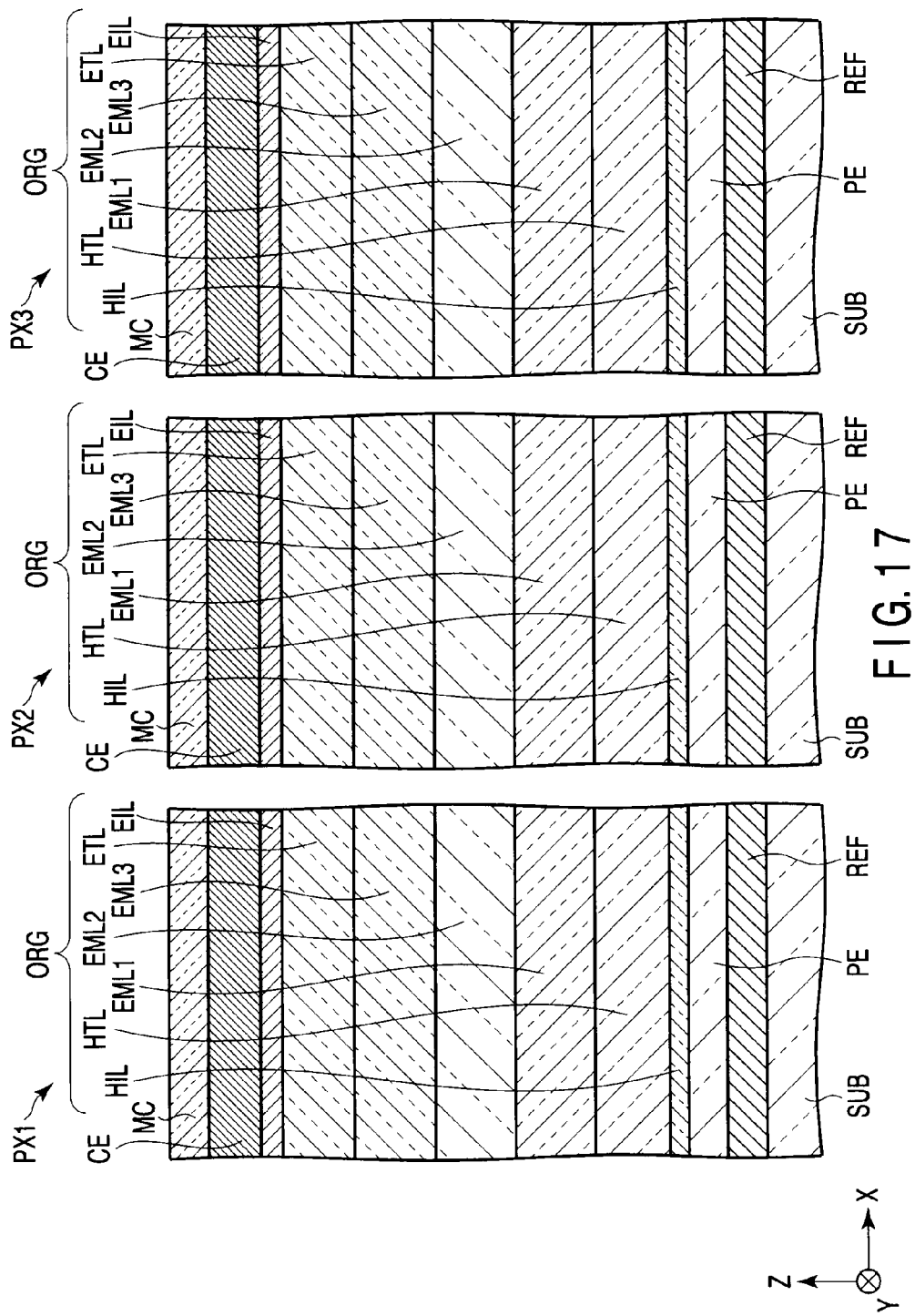
FIG. 17 is a sectional view schematically showing the organic EL elements of the organic EL display according to the seventh embodiment of the present invention.

FIG. 17 is a sectional view schematically showing the organic EL elements of the organic EL display according to the seventh embodiment of the present invention.

The display according to the seventh embodiment is the same as the top emission display according to the fifth embodiment except that the following structure is employed. That is, as shown in FIG. 17, the display according to the seventh embodiment further includes the hole injection layer HIL, the hole-transporting layer HTL, the electron injection layer HIL, the electron-transporting layer ETL and the optical matching layer MC.

The optical matching layer MC is a light-transmitting layer, typically a transparent layer. The optical matching layer MC achieves an optical matching between the organic layer ORG and a gaseous layer such as nitrogen layer interposed between the insulating substrate SUB and the sealing substrate SUB2. The refractive index of the optical matching layer MC is almost equal to the refractive index of the organic layer ORG. For example, as the optical matching layer, a transparent inorganic insulating layer such as SiON layer, a transparent inorganic conductive layer such as ITO layer, or a transparent organic layer such as organic layer or layers included in the organic layer ORG can be used. When the optical matching layer is used, the outcoupling efficiency can be increased.

According to an example, the display employing the structure shown in FIG. 17 achieved 4 times the luminous efficiency of the display having the same structure except that the optical matching layer MC was omitted. Further, when the former and the latter were driven such that white images with the same luminance were displayed, the power consumption of the former was one-quarter the power consumption of the latter. Note that in this example, the thickness of the pixel electrodes PE was 100 nm, the thickness of the hole-transporting layer HTL was 75 nm, and the thickness of the optical matching layer MC was 70 nm.

Figure 18:
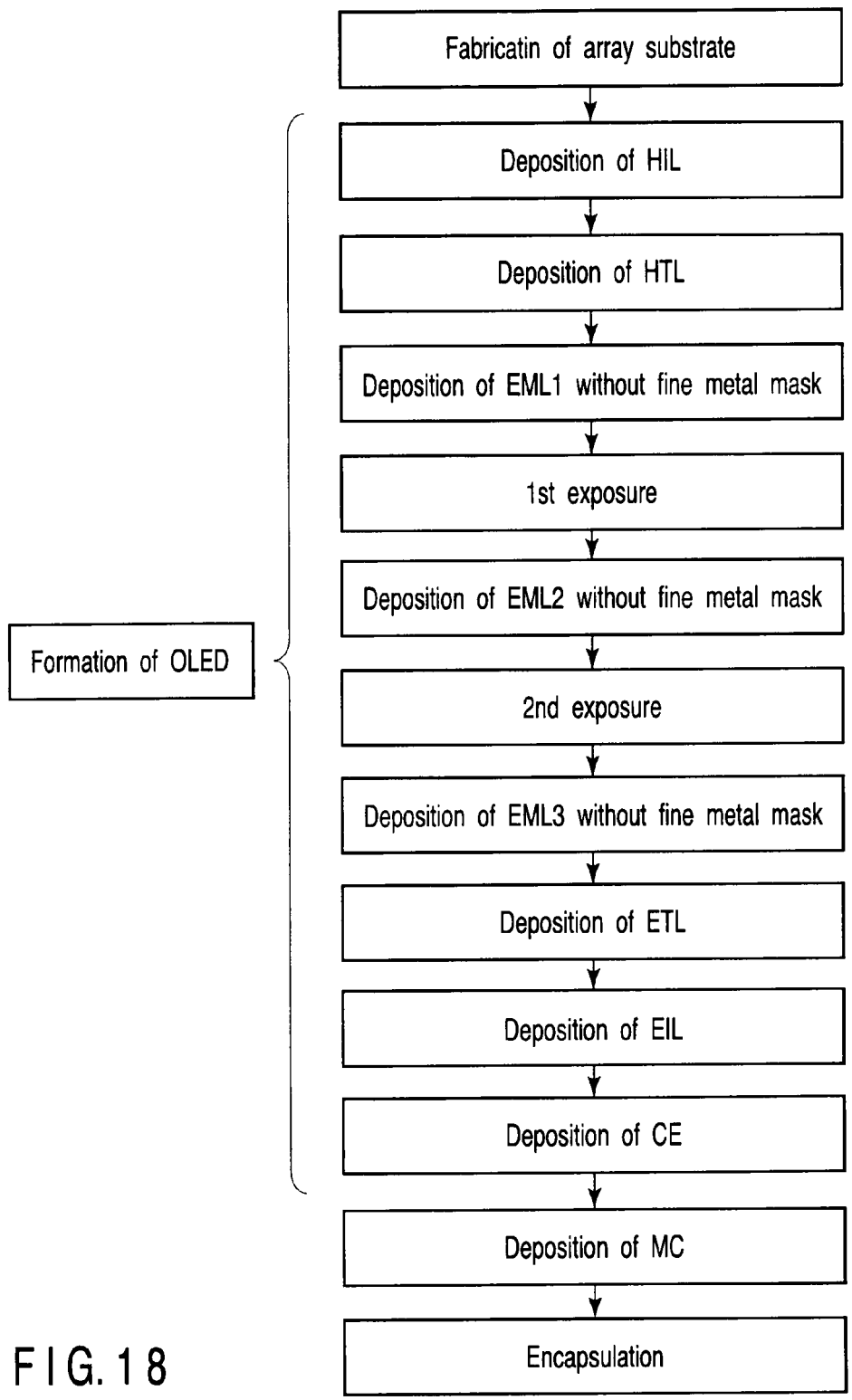
FIG. 18 is a flow chart showing an example of the manufacturing process for the display according to the seventh embodiment of the present invention.

FIG. 18 is a flow chart showing an example of the manufacturing process for the display according to the seventh embodiment of the present invention. As shown in FIG. 18, this display can be manufactured by the same method as described with reference to FIG. 14 except that the deposition of the optical matching layer MC is performed between the deposition of the counter electrode CE and the encapsulation.

Eighth Embodiment

Figure 19:
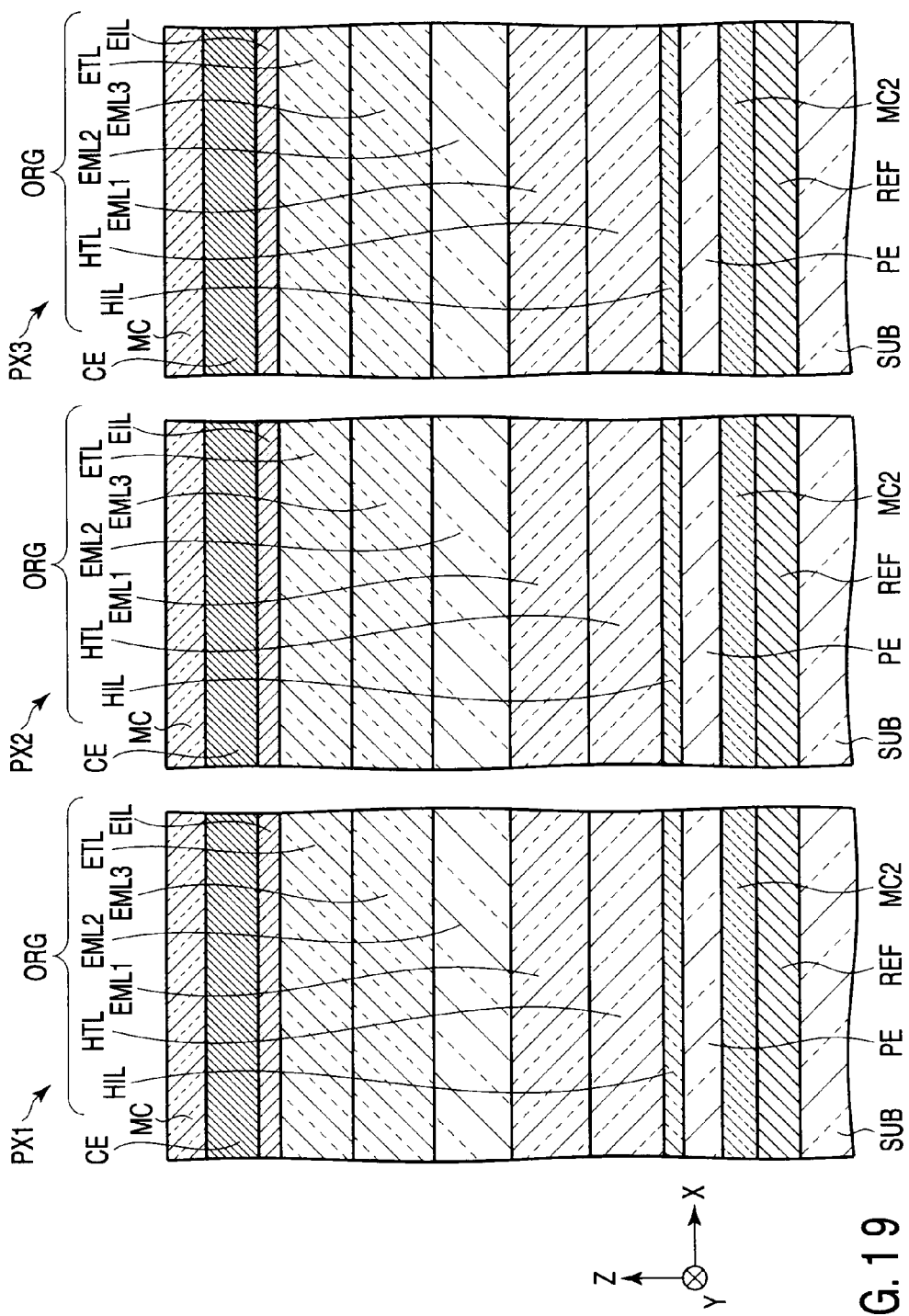
FIG. 19 is a sectional view schematically showing the organic EL elements of the organic EL display according to the eighth embodiment of the present invention.

FIG. 19 is a sectional view schematically showing the organic EL elements of the organic EL display according to the eighth embodiment of the present invention.

The display according to the eight embodiment is the same as the top emission display according to the seventh embodiment except that it further includes the adjustment layer MC2 interposed between the reflective layer REF and the pixel electrodes PE.

The adjustment layer MC2 is a light-transmitting layer. The refractive index of the adjustment layer MC2 may be almost equal to the refractive index of the organic layer MC2. As the adjustment layer MC2, for example, a transparent inorganic insulating layer such as SiN layer, a transparent inorganic conductive layer such as ITO layer, or a transparent organic layer such as an organic layer or layers included in the organic layer ORG can be used.

In general, a top emission display is higher in the refractive indices of front electrodes than a bottom emission display. Thus, the effect of the multi-beam interference on the luminous efficiency is greater in the top emission display than in the bottom emission display. Therefore, in the top emission display, it is desirable that the optical path length between the reflective layer REF and the counter electrode CE is designed to cause optical resonance. However, since the pixels PX1 to PX3 are different in emission colors from one another, the optimum optical path lengths for the pixels PX1 to PX3 are different from one another.

In this display, the portions of the adjustment layer MC2 that correspond to the pixel electrodes PE of the pixels PX1, the portions of the adjustment layer MC2 that correspond to the pixel electrodes PE of the pixels PX2, and the portions of the adjustment layer MC2 that correspond to the pixel electrodes PE of the pixels PX3 are equal in thicknesses to one another. In addition, this thickness is almost equal to the least common multiple of one-quarter the dominant wavelength of the light emitted by the emitting layer EML1, one-quarter the dominant wavelength of the light emitted by the emitting layer EML2, and one-quarter the dominant wavelength of the light emitted by the emitting layer EML3. In short, in each of the pixels PX1 to PX3, the constructive interference occurs. Thus, this display achieves a higher luminous efficiency, and therefore, is lower in power consumption.

According to an example, the display employing the structure shown in FIG. 19 achieved 6 times the luminous efficiency of the display having the same structure except that the optical matching layer MC and the adjustment layer MC2 were omitted. Further, the display employing the structure shown in FIG. 19 achieved 1.5 times the luminous efficiency of the display having the same structure except that the adjustment layer MC2 was omitted. In addition, the display employing the structure shown in FIG. 19 was excellent in color purities of red, green and blue, and achieved 100% or more of the color reproducibility required of NTSC (national television system committee) system. Note that in this example, the thickness of the hole-transporting layer HTL was 40 nm, and an SiN layer with a thickness of 410 nm was used as the adjustment layer MC2.

Ninth Embodiment

Figure 20:
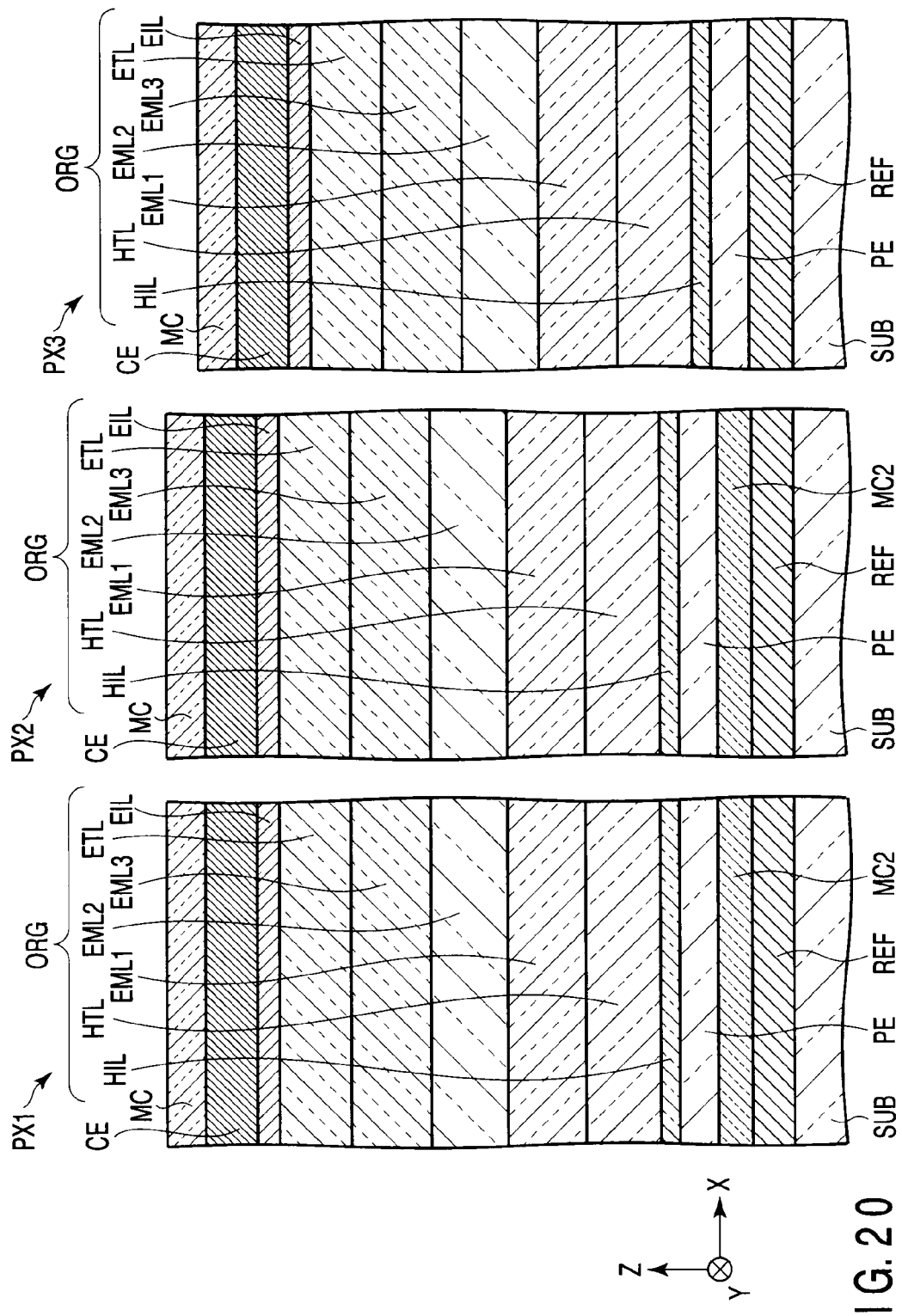
FIG. 20 is a sectional view schematically showing the organic EL elements of the organic EL display according to the ninth embodiment of the present invention.

FIG. 20 is a sectional view schematically showing the organic EL elements of the organic EL display according to the ninth embodiment of the present invention.

The display according to the ninth embodiment is the same as the top emission display according to the eighth embodiment except that the following structure is employed in the adjustment layer. That is, in this display, the adjustment layer MC2 is provided not at positions corresponding to the pixel electrodes of the pixels PX3, but at positions corresponding to the pixel electrodes of the pixels PX1 and PX2.

When such a structure is employed, the optical thickness of the adjustment layer MC2 can be determined without considering the optical path length between the reflective layer REF and the counter electrode CE in the pixels PX3. That is, when such a structure is employed, the design flexibility is increased. Therefore, higher luminous efficiencies and higher color purities can be easily achieved in the pixels PX1 to PX3.

According to an example, the display employing the structure shown in FIG. 20 achieved 1.5 times the luminous efficiency of the display employing the structure shown in FIG. 19. In other words, in the case where the structure shown in FIG. 20 was employed, the power consumption could be decreased as compared with the case where the structure shown in FIG. 19 was employed. Note that in this example, an SiN layer with a thickness of 390 nm was used as the adjustment layer MC2 of the display employing the structure shown in FIG. 20, while an SiN layer with a thickness of 410 nm was used as the adjustment layer MC2 of the display employing the structure shown in FIG. 19.

Tenth Embodiment

Figure 21:
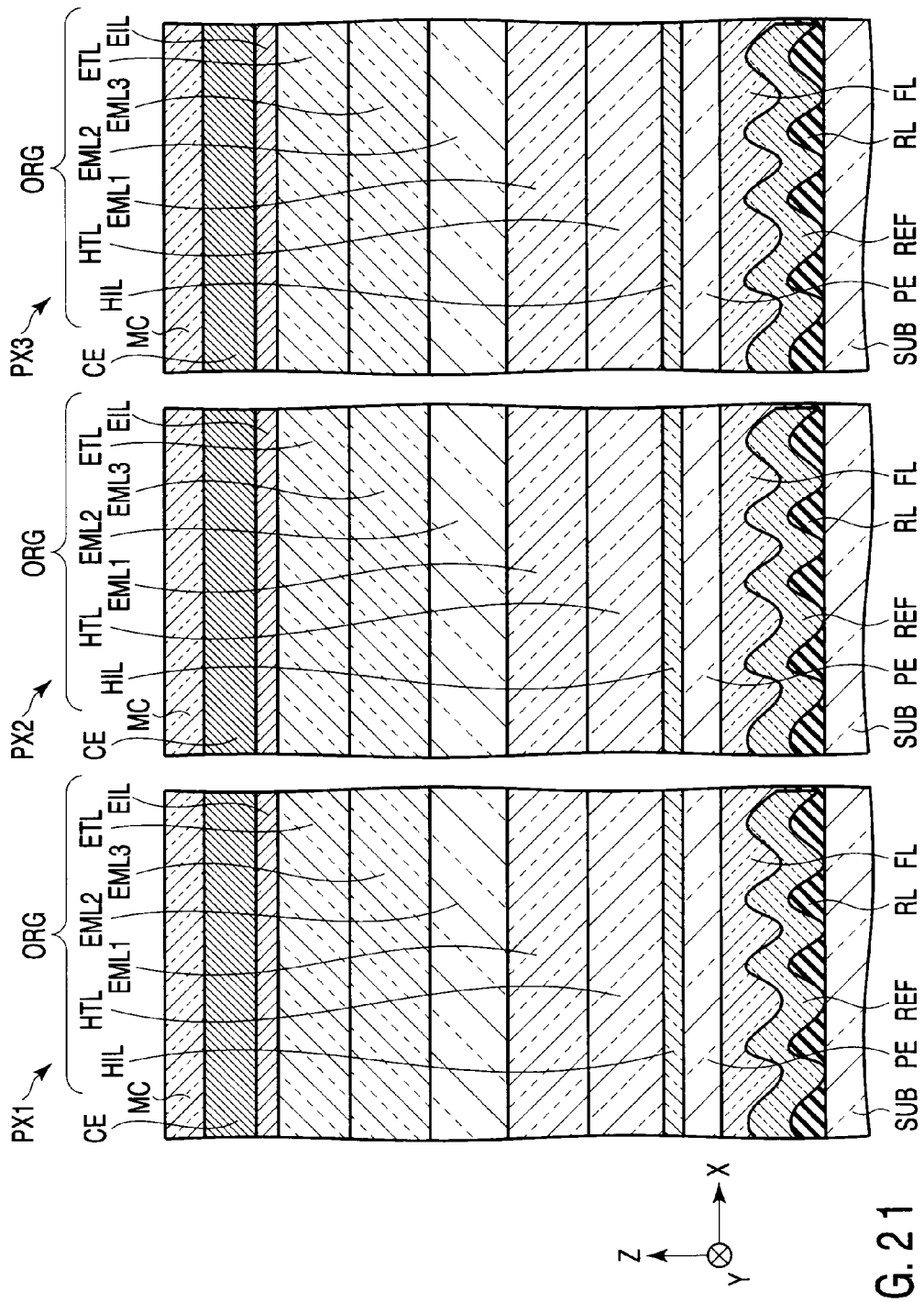
FIG. 21 is a sectional view schematically showing the organic EL elements of the organic EL display according to the tenth embodiment of the present invention.

FIG. 21 is a sectional view schematically showing the organic EL elements of the organic EL display according to the tenth embodiment of the present invention.

The display according to the tenth embodiment is the same as the top emission display according to the seventh embodiment except that the following structure is employed. That is, in this display, the reflective layer REF is not a specular reflector but a light-scattering reflective layer having a relief structure thereon. In addition, the display further includes the underlayer RL and the flattening layer FL.

The underlayer RL is interposed between the substrate SUB and the reflective layer REF. A relief structure is provided to the surface of the underlayer RL. The underlayer RL produces the relief structure on the surface of the reflective layer REF. The underlayer RL is made of an organic material such as resin, for example.

The flattening layer FL is interposed between the reflective layer REF and the pixel electrodes PE. The flattening layer FL covers the relief structure of the reflective layer REF to form a flat surface. The flattening layer FL is made of an organic material such as resin, for example.

When the reflective layer REF has a light-scattering property, the multi-beam interference described above hardly occurs. Thus, it is not necessary to consider the effect of the multi-beam interference on the luminous efficiency. Therefore, in the case where the reflective layer REF has a light-scattering property, it is not necessary to consider the optical path length between the reflective layer REF and the counter electrode CE when designing the organic EL elements OLED.

Eleventh Embodiment

Figure 22:
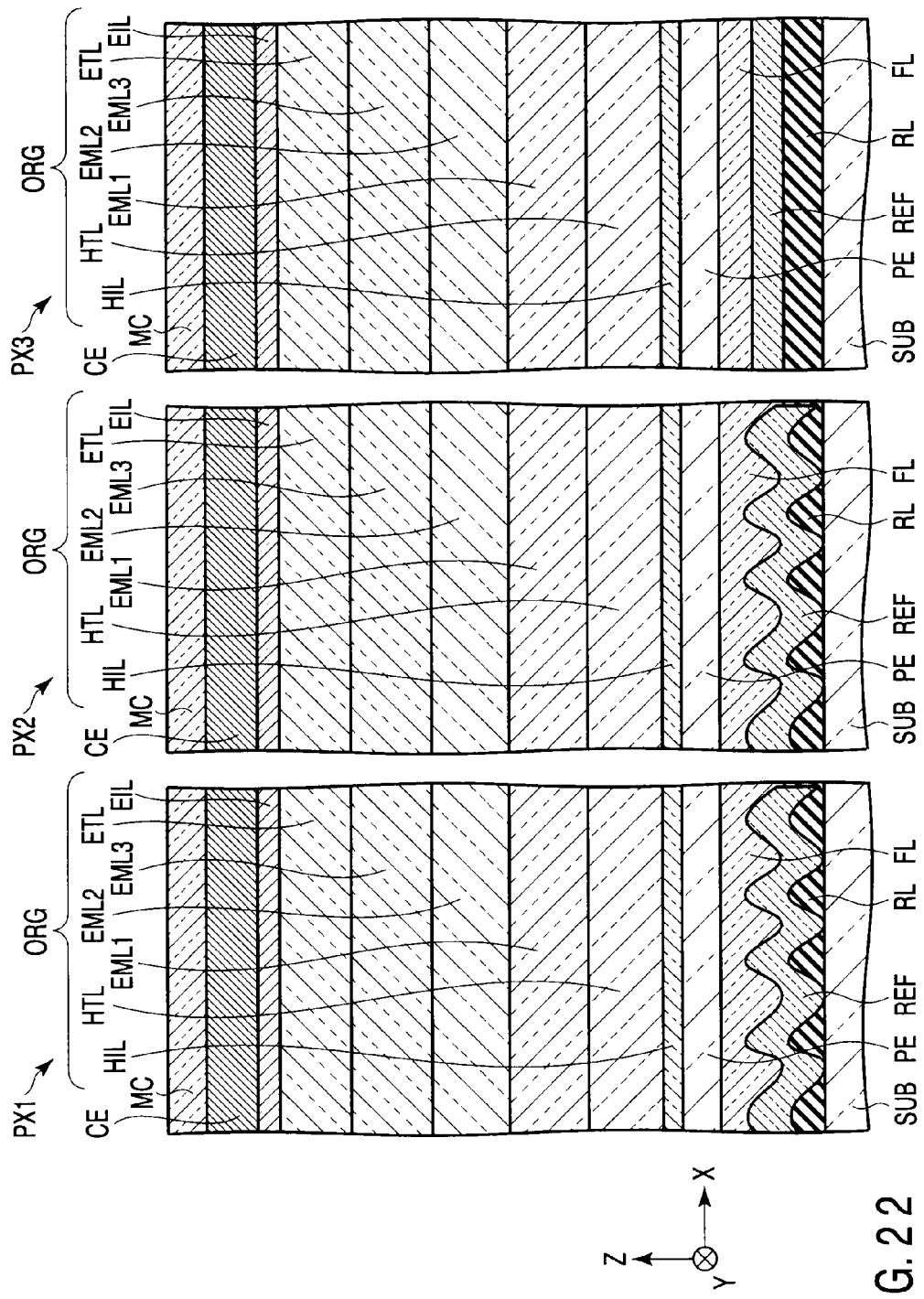
FIG. 22 is a sectional view schematically showing the organic EL elements of the organic EL display according to the eleventh embodiment of the present invention.

FIG. 22 is a sectional view schematically showing the organic EL elements of the organic EL display according to the eleventh embodiment of the present invention.

The display according to the eleventh embodiment is the same as the top emission display according to the tenth embodiment except that the following structure is employed. That is, in this display, the portions of the reflective layer REF that correspond to the pixel electrodes PE of the pixels PX1 and PX2 has a light-scattering property, and the portions of the reflective layer REF that correspond to the pixel electrodes PE of the pixels PX3 are specular reflectors.

In general, the luminous efficiency of the emitting layer that emits blue light is lower than the luminous efficiencies of the emitting layers that emit green light and red light. Thus, in ordinary cases, the organic EL elements that emit blue light is prone to be deteriorated as compared with the organic EL elements that emit green light and red light.

When the structure shown in FIG. 22 is employed, it is possible to cause the constructive interference only in the pixels PX3. Therefore, for example, in the case where the emission color of the emitting layer EML1 is red, the emission color of the emitting layer EML2 is green, and the emission color of the emitting layer EML3 is blue in the display shown in FIG. 22, it is possible to make the deterioration of the pixels PX3, which emit blue light, less prone to occur. Further, in this case, the color purity of blue can be increased.

Twelfth Embodiment

Figure 23:
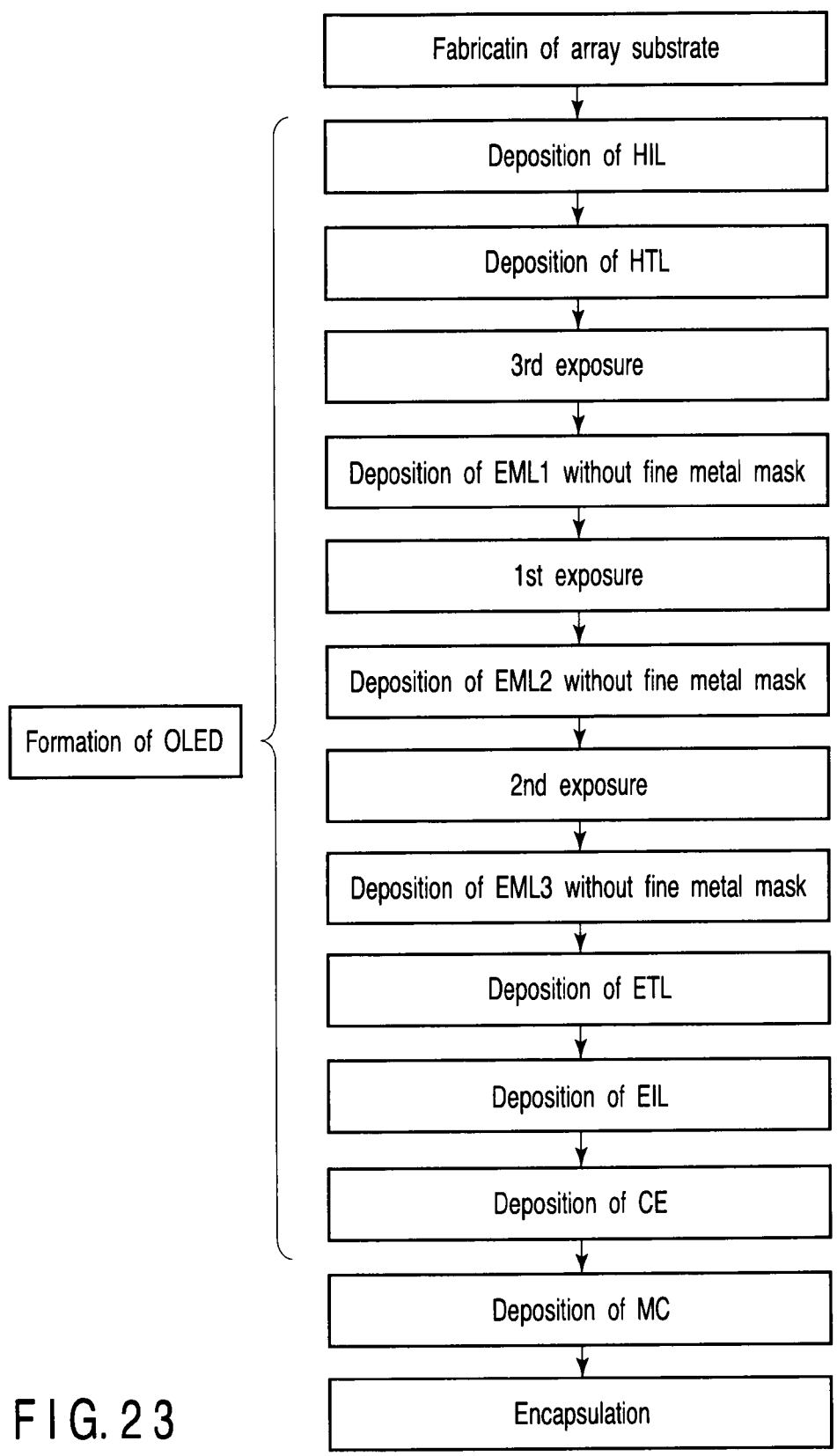
FIG. 23 is a flow chart showing an example of the manufacturing process for the display according to the twelfth embodiment of the present invention.

FIG. 23 is a flow chart showing an example of the manufacturing process for the display according to the twelfth embodiment of the present invention.

The manufacturing process shown in FIG. 23 is the same as the manufacturing process shown in FIG. 18 except that the third exposure is performed.

The third exposure is performed after the deposition of the hole-transporting layer HTL before depositing the emitting layer EML1. The third exposure includes irradiating whole or parts of the hole-transporting layer HTL with light such as ultraviolet light. For example, the regions of the hole-transporting layer HTL that correspond to the pixel electrodes PE of the pixels PX2 and PX3 are irradiated with light without irradiating the regions of the hole-transporting layer HTL that correspond to the pixel electrodes PE of the pixels PX1. Alternatively, the regions of the hole-transporting layer HTL that correspond to the pixel electrodes PE of the pixels PX1 to PX3 are irradiated with light.

The electrical characteristics of the hole-transporting layer HTL may be changed when irradiated with light such as ultraviolet light. Thus, according to the process shown in FIG. 18, it is possible that the regions of the hole-transporting layer HTL that correspond to the pixel electrodes PE of the pixels PX1 are different in the electrical characteristics from the regions of the hole-transporting layer HTL that correspond to the pixel electrodes PE of the pixels PX2 and PX3.

In the case where the first and second exposures change the electrical characteristics of the hole-transporting layer HTL, the conditions for the first and second exposures greatly affect the emission colors and/or luminous efficiencies of the pixels PX1 to PX3 as compared with the case where such a change in the electrical characteristics do not occur. Thus, when the process shown in FIG. 18 is employed, it is necessary in some cases to precisely control the conditions for the exposures.

When the hole-transporting layer HTL is irradiated with light before depositing the emitting layer EML1, it is possible to prevent or decrease the change in the electrical characteristics of the hole-transporting layer HTL due to the first and second exposures. Thus, it is possible to decrease the effect of the conditions for the first and second exposures on the emission colors and/or luminous efficiencies of the pixels PX1 to PX3. Therefore, the conditions for the first and second exposures can be controlled easier.

Thirteenth Embodiment

Figure 24:
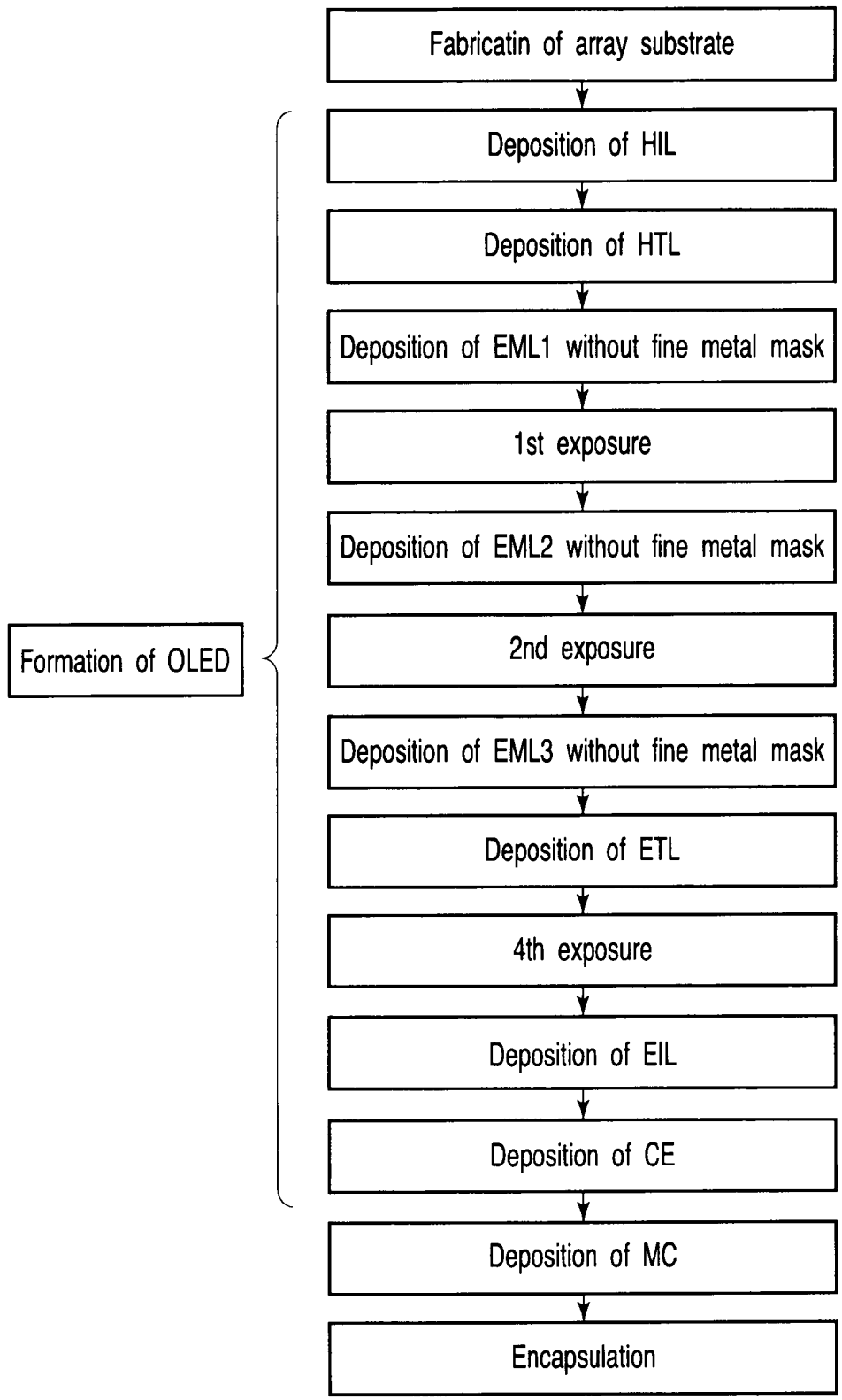
FIG. 24 is a flow chart showing an example of the manufacturing process for the display according to the thirteenth embodiment of the present invention.

FIG. 24 is a flow chart showing an example of the manufacturing process for the display according to the thirteenth embodiment of the present invention.

The manufacturing process shown in FIG. 24 is the same as the manufacturing process shown in FIG. 18 except that the fourth exposure is further performed.

The fourth exposure is performed after the deposition of the electron-transporting layer ETL. The fourth exposure includes irradiating a part of the electron-transporting layer ETL with light such as ultraviolet light. For example, the regions of the electron-transporting layer that correspond to the pixel electrodes PE of the pixels PX3 are irradiated with light without irradiating the regions of the electron-transporting layer ETL that correspond to the pixel electrodes PE of the pixels PX1 and PX2. Alternatively, the regions of the electron-transporting layer ETL that correspond to the pixel electrodes PE of the pixels PX2 are irradiated with light without irradiating the regions of the electron-transporting layer ETL that correspond to the pixel electrodes PE of the pixels PX1 and PX3. Alternatively, the regions of the electron-transporting layer ETL that correspond to the pixel electrodes PE of the pixels PX1 are irradiated with light without irradiating the regions of the electron-transporting layer ETL that correspond to the pixel electrodes PE of the pixels PX2 and PX3.

The electrical characteristics of the electron-transporting layer ETL may be changed when irradiated with light such as ultraviolet light. Thus, when the fourth exposure is performed, the electron/hole injection balance can be optimized with a higher degree of flexibility.

Fourteenth Embodiment

Figure 25:
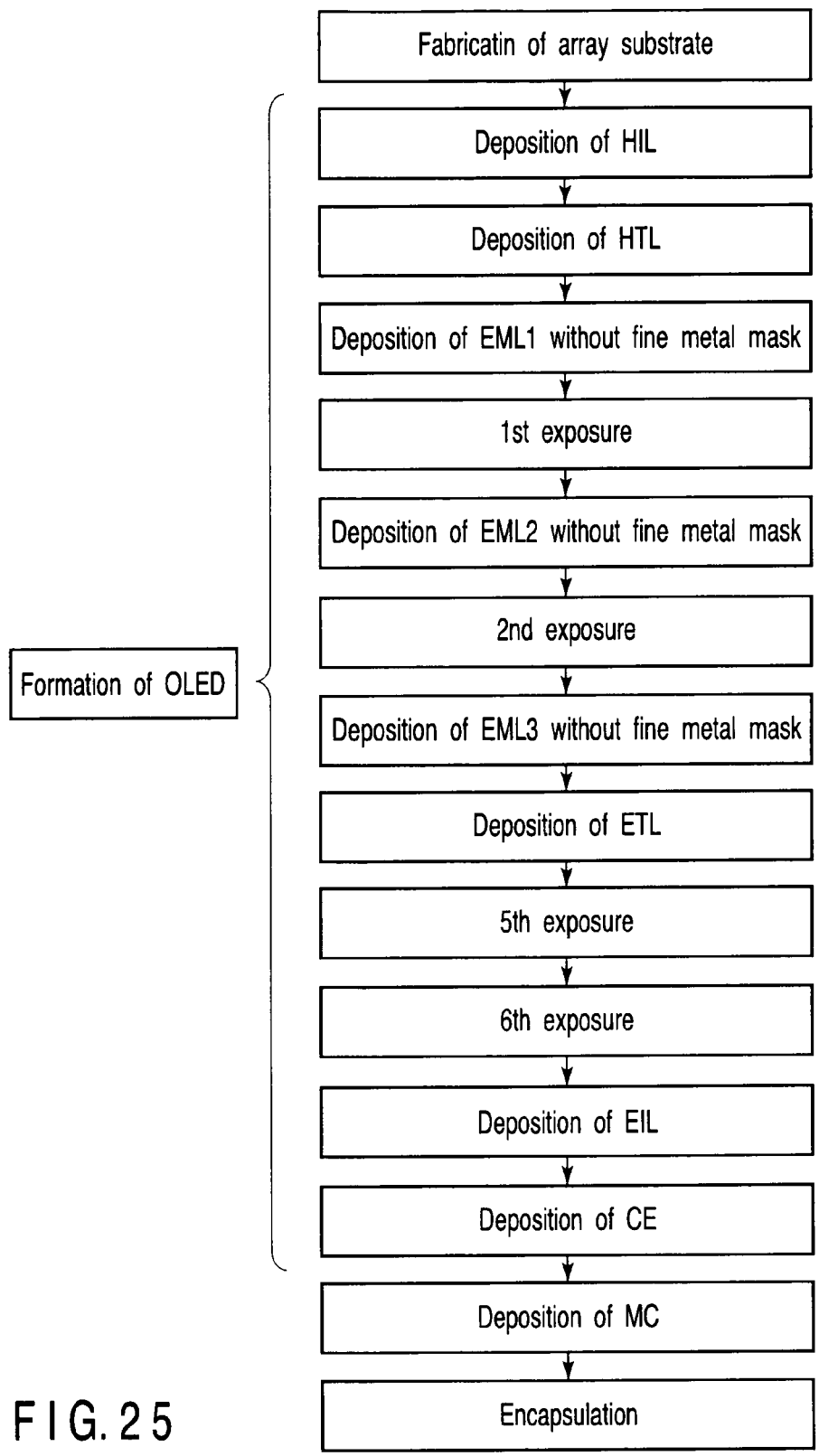
FIG. 25 is a flow chart showing an example of the manufacturing process for the display according to the fourteenth embodiment of the present invention.

FIG. 25 is a flow chart showing an example of the manufacturing process for the display according to the fourteenth embodiment of the present invention.

The manufacturing process shown in FIG. 25 is the same as the manufacturing process shown in FIG. 24 except that the fifth and sixth exposures are performed instead of the fourth exposure.

The fifth and sixth exposures are performed after the deposition of the electron-transporting layer ETL. The sixth exposure is performed after the fifth exposure. Each of the fifth and sixth exposures includes irradiating a part of the electron-transporting layer ETL with light such as ultraviolet light.

According to the process shown in FIG. 25, it is possible that the regions of the electron-transporting layer ETL that correspond to the pixel electrodes PE of the pixels PX1, the regions of the electron-transporting layer ETL that correspond to the pixel electrodes PE of the pixels PX2, and the regions of the electron-transporting layer ETL that correspond to the pixel electrodes PE of the pixels PX3 are different in the electrical characteristics from one another. Therefore, in the case where the process shown in FIG. 25 is employed, the electron/hole injection balance can be optimized with a higher degree of flexibility as compared with the case where the process shown in FIG. 24 is employed.

Fifteenth Embodiment

FIG. 26 is a sectional view schematically showing an example of the structure that can be employed in the organic EL display according to the fifteenth embodiment of the present invention.

The display according to the present embodiment is the same as the display according to the first embodiment except that the insulating partition layer PI is omitted.

As described above, the insulating partition layer PI plays a role of the spacer that prevents the fine metal mask from coming in contact with the portions of the emitting layers EML1 to EML3 corresponding to the pixel electrodes PE. Thus, when the emitting layers EML1 to EML3 are formed without using fine metal mask, the insulating partition layer PI can be omitted. Omitting the insulating partition layer PI makes it possible to simplify the manufacturing process and decrease the materials cost.

Sixteenth Embodiment

Figure 27:
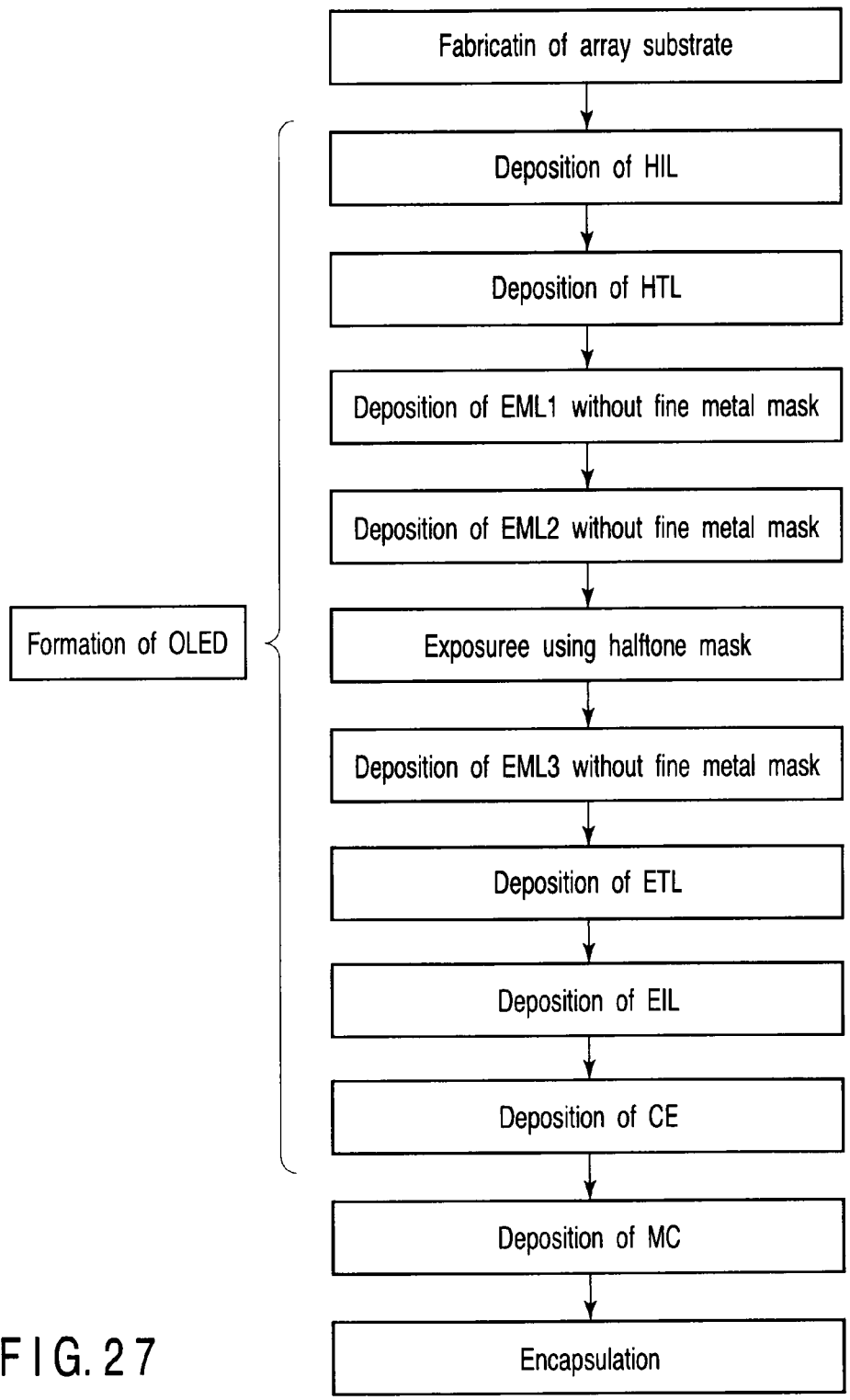
FIG. 27 is a flow chart showing an example of the manufacturing process for the display according to the sixteenth embodiment of the present invention.

FIG. 27 is a flow chart showing an example of the manufacturing process for the display according to the sixteenth embodiment of the present invention.

The manufacturing process shown in FIG. 27 is the same as the manufacturing process shown in FIG. 18 except that the first and second exposures are not performed and an exposure using a halftone mask is performed.

The particular exposure includes irradiating a part of the emitting layer EML1 and a part of the emitting layer EML2 with light such as ultraviolet light. For example, the regions of the emitting layers EML1 and EML2 that correspond to the pixel electrodes PE of the pixels PX2 and PX3 are irradiated with light, without irradiating the regions of the emitting layers EML1 and EML2 that correspond to the pixel electrodes PE of the pixels PX1 with light. In addition, the exposure value at the regions of the emitting layers EML1 and EML2 that correspond to the pixel electrodes of the PX3 is set greater than the exposure value at the regions of the emitting layers EML1 and EML2 that correspond to the pixel electrodes of the PX2.

By doing so, the regions of the emitting layers EML1 and EML2 that correspond to the pixel electrodes PE of the pixels PX2 become larger in the hole mobility and/or hole injection efficiencies than the regions of the emitting layers EML1 and EML2 that correspond to the pixel electrodes PE of the pixels PX1. In addition, the regions of the emitting layers EML1 and EML2 that correspond to the pixel electrodes PE of the pixels PX3 become larger in the hole mobility and/or hole injection efficiencies than the regions of the emitting layers EML1 and EML2 that correspond to the pixel electrodes PE of the pixels PX2.

Thus, it is possible, for example, that the pixels PX1 have the optimum electron/hole injection balance at the emitting layer EML1, the pixels PX2 have the optimum electron/hole injection balance at the emitting layer EML2, and the pixels PX3 have the optimum electron/hole injection balance at the emitting layer EML3. Therefore, when such a structure is employed that the above-described color conversion hardly occurs, for example, it is possible that the pixels PX1 emit red light, the pixels PX2 emit green light, and the pixels PX3 emit blue light.

Thus, according to the process shown in FIG. 27, the display can be manufactured with a smaller number of exposures. Therefore, a higher productivity can be achieved.

In each embodiment described above, the organic EL display includes a group of the pixels PX1, a group of the pixels PX2, and a group of the pixels PX3. One of the pixel groups may be omitted. Alternatively, the above-described display may further include one or more pixel groups different in emitting colors of the organic EL elements OLED from the three pixel groups.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic EL device comprising:
   a substrate;
   an array of electrodes including first and second electrodes and located above the substrate, top surfaces of the first and second electrodes having almost the same height;
   a counter electrode facing the array of electrodes;
   an organic layer including a first emitting layer interposed between the array of electrodes and the counter electrode and a second emitting layer interposed between the first emitting layer and the counter electrode, each of the first and second emitting layers being a continuous layer extending over a display region including the array of electrodes, a region of the first emitting layer corresponding to the second electrode being quenched, wherein portions of a laminate including 1) the array of electrodes, 2) the organic layer and 3) the counter electrode that correspond to the first and second electrodes form first and second organ EL elements different in luminous colors from each other;
   a reflective layer located between the substrate and the array of electrodes; and
   an adjustment layer having a light-transmitting property and located between the reflective layer and the first and second electrodes, wherein portions of the adjustment layer corresponding to the first and second electrodes have a thickness almost equal to a least common multiple of one-quarter a dominant wavelength of light emitted by the first emitting layer and one-quarter a dominant wavelength of light emitted by the second emitting layer.

2. An organic EL device comprising;
   a substrate having a main surface, the main surface including first and second areas;
   first and second electrodes located above the first and second areas, respectively;
   a first emitting layer emitting a first light and extending above the first and second electrodes, a region of the first emitting layer corresponding to the second electrode being quenched;
   a second emitting layer emitting a second light different in luminescent colors from the first light and extending above the first emitting layer;
   a third electrode located above the second emitting layer;
   a reflective layer located between the substrate and the first and second electrodes; and
   an adjustment layer having a light-transmitting property and located between the reflective layer and the first and second electrodes, wherein portions of the adjustment layer corresponding to the first and second electrodes have a thickness almost equal to a least common multiple of one-quarter a dominant wavelength of the first light and one-quarter a dominant wavelength of the second light.

* * * * *